(12) United States Patent
Pickard et al.

(10) Patent No.: US 12,388,056 B1
(45) Date of Patent: Aug. 12, 2025

(54) LINEAR LIGHTING SYSTEMS AND PROCESSES

(71) Applicant: Korrus, Inc., Los Angeles, CA (US)

(72) Inventors: Paul Pickard, Acton, CA (US); Noam Meir, Herzliya (IL); Raghuram L. V. Petluri, Cerritos, CA (US); Ariel Meir, North Miami Beach, FL (US)

(73) Assignee: KORRUS, INC., Los Angeles, CA (US)

( * ) Notice: Subject to any disclaimer, the term of this patent is extended or adjusted under 35 U.S.C. 154(b) by 0 days.

(21) Appl. No.: 18/348,991

(22) Filed: Jul. 7, 2023

Related U.S. Application Data

(60) Continuation-in-part of application No. 18/303,849, filed on Apr. 20, 2023, now Pat. No. 12,062,645,
(Continued)

(51) Int. Cl.
*H01L 25/075* (2006.01)
*F21K 9/64* (2016.01)
(Continued)

(52) U.S. Cl.
CPC ............ *H01L 25/0753* (2013.01); *F21K 9/64* (2016.08); *F21K 9/90* (2013.01); *F21S 4/20* (2016.01);
(Continued)

(58) Field of Classification Search
CPC ......... H01L 25/0753; F21K 9/64; F21K 9/90; F21S 4/20; F21V 9/35; H05B 45/20
See application file for complete search history.

(56) References Cited

U.S. PATENT DOCUMENTS

| | | |
|---|---|---|
| 3,262,250 A | 7/1966 | Fowler |
| 3,434,897 A | 3/1969 | Caretta |
| | (Continued) | |

FOREIGN PATENT DOCUMENTS

| | | |
|---|---|---|
| CA | 2623604 | 8/2009 |
| CN | 101592291 A | 12/2009 |
| | (Continued) | |

OTHER PUBLICATIONS

International Patent Application No. PCT/US2018/015449; Int'l Preliminary Report on Patentability; dated Aug. 8, 2019; 8 pages.
(Continued)

*Primary Examiner* — Joseph L Williams
(74) *Attorney, Agent, or Firm* — Jay M. Brown

(57) ABSTRACT

Linear lighting system including tray extended along elongation directions and having base forming bottom interior surface of tray; first sidewall extending upward from base towards emission aperture of linear lighting system and second sidewall spaced apart across base from first sidewall and extending upward from base towards emission aperture. System further includes circuit board located on first sidewall in tray, plurality of LEDs located on circuit board and mutually spaced apart on first sidewall along elongation directions of tray and positioned for light emissions in directions facing toward second sidewall; and protuberance on base and interposed between LEDs and second sidewall, protuberance positioned for diverting light emissions from plurality of LEDs toward emission aperture. System having tray with first sidewall including angled reflective face and second sidewall including further angled reflective face, the faces positioned for reflecting light emissions toward the emission aperture.

22 Claims, 16 Drawing Sheets

Related U.S. Application Data which is a division of application No. 17/653,988, filed on Mar. 8, 2022, now Pat. No. 11,658,163, which is a continuation of application No. 16/480,867, filed as application No. PCT/US2018/015449 on Jan. 26, 2018, now Pat. No. 11,296,057.

(60) Provisional application No. 63/511,841, filed on Jul. 3, 2023, provisional application No. 62/451,612, filed on Jan. 27, 2017, provisional application No. 62/451,616, filed on Jan. 27, 2017.

(51) Int. Cl.
| | | |
|---|---|---|
| *F21K 9/90* | (2016.01) | |
| *F21S 4/20* | (2016.01) | |
| *F21V 9/35* | (2018.01) | |
| *H05B 45/20* | (2020.01) | |
| *H10H 20/851* | (2025.01) | |

(52) U.S. Cl.
CPC .............. *F21V 9/35* (2018.02); *H05B 45/20* (2020.01); *H10H 20/8513* (2025.01)

(56) References Cited

U.S. PATENT DOCUMENTS

| | | |
|---|---|---|
| 4,445,164 A | 4/1984 | Giles, III |
| 4,580,859 A | 4/1986 | Frano |
| 4,603,496 A | 8/1986 | Latz |
| 4,727,648 A | 3/1988 | Savage, Jr. |
| 4,837,927 A | 6/1989 | Savage, Jr. |
| 5,087,212 A | 2/1992 | Hanami |
| 5,174,649 A | 12/1992 | Alston |
| 5,241,457 A | 8/1993 | Sasajima |
| 5,387,901 A | 2/1995 | Hardt |
| 5,436,809 A | 7/1995 | Brassier |
| 5,450,664 A | 9/1995 | Babow |
| 5,490,048 A | 2/1996 | Brassier |
| 5,628,557 A | 5/1997 | Huang |
| 5,632,551 A | 5/1997 | Roney |
| 5,658,066 A | 8/1997 | Hirsch |
| 5,821,695 A | 10/1998 | Vilanilam |
| 6,283,612 B1 | 9/2001 | Hunter |
| 6,354,714 B1 | 3/2002 | Rhodes |
| 6,426,704 B1 | 7/2002 | Hutchison |
| 6,439,743 B1 | 8/2002 | Hutchison |
| 6,450,662 B1 | 9/2002 | Hutchison |
| 6,450,664 B1 | 9/2002 | Kelly |
| 6,473,002 B1 | 10/2002 | Hutchison |
| 6,474,839 B1 | 11/2002 | Hutchison |
| 6,481,130 B1 | 11/2002 | Wu |
| 6,527,422 B1 | 3/2003 | Hutchison |
| 6,530,674 B2 | 3/2003 | Grierson |
| 6,582,103 B1 | 6/2003 | Popovich |
| 6,590,235 B2 | 7/2003 | Carey |
| 6,601,970 B2 | 8/2003 | Ueda |
| 6,676,284 B1 | 1/2004 | Wynne Willson |
| 6,773,138 B2 | 8/2004 | Coushaine |
| 6,824,296 B2 | 11/2004 | Souza |
| 6,827,469 B2 | 12/2004 | Coushaine |
| 6,851,832 B2 | 2/2005 | Tieszen |
| 6,880,952 B2 | 4/2005 | Kiraly |
| 6,882,111 B2 | 4/2005 | Kan |
| 6,893,144 B2 | 5/2005 | Fan |
| 6,979,097 B2 | 12/2005 | Elam |
| 7,093,958 B2 | 8/2006 | Coushaine |
| 7,111,964 B2 | 9/2006 | Suehiro |
| 7,112,926 B2 | 9/2006 | Himori |
| 7,132,804 B2 | 11/2006 | Lys |
| 7,150,553 B2 | 12/2006 | English |
| 7,159,997 B2 | 1/2007 | Reo |
| 7,161,311 B2 | 1/2007 | Mueller |
| 7,210,957 B2 | 5/2007 | Mrakovich |
| 7,221,104 B2 | 5/2007 | Lys |
| 7,229,192 B2 | 6/2007 | Mayfield, III |
| 7,261,435 B2 | 8/2007 | Gould |
| 7,267,461 B2 | 9/2007 | Kan |
| 7,360,925 B2 | 4/2008 | Coushaine |
| 7,414,269 B2 | 8/2008 | Groetsch |
| 7,455,422 B2 | 11/2008 | Gould |
| 7,456,499 B2 | 11/2008 | Loh |
| 7,481,552 B2 | 1/2009 | Mayfield, III |
| 7,481,566 B2 | 1/2009 | Han |
| 7,530,716 B2 | 5/2009 | Mayfield, III |
| 7,540,761 B2 | 6/2009 | Weber |
| 7,549,786 B2 | 6/2009 | Higley |
| 7,575,332 B2 | 8/2009 | Cok |
| 7,595,113 B2 | 9/2009 | Miyoshi |
| 7,604,365 B2 | 10/2009 | Chang |
| 7,654,703 B2 | 2/2010 | Kan |
| 7,700,965 B2 | 4/2010 | Chang |
| 7,703,951 B2 | 4/2010 | Piepgras |
| 7,712,926 B2 | 5/2010 | Matheson |
| 7,727,009 B2 | 6/2010 | Goto |
| 7,731,396 B2 | 6/2010 | Fay |
| 7,744,266 B2 | 6/2010 | Higley |
| 7,766,518 B2 | 8/2010 | Piepgras |
| 7,806,562 B2 | 10/2010 | Behr |
| 7,810,955 B2 | 10/2010 | Stimac |
| 7,810,995 B2 | 10/2010 | Fadler |
| 7,841,753 B2 | 11/2010 | Liu |
| 7,857,482 B2 | 12/2010 | Reo |
| 7,866,847 B2 | 1/2011 | Zheng |
| 7,878,683 B2 | 2/2011 | Logan |
| 7,918,589 B2 | 4/2011 | Mayfield, III |
| 7,922,364 B2 | 4/2011 | Tessnow |
| 7,923,907 B2 | 4/2011 | Tessnow |
| 7,952,114 B2 | 5/2011 | Gingrich, III |
| 7,961,113 B2 | 6/2011 | Rabiner |
| 7,972,038 B2 | 7/2011 | Albright |
| 7,988,336 B1 | 8/2011 | Harbers |
| 7,997,758 B2 | 8/2011 | Zhang |
| 8,033,680 B2 | 10/2011 | Sharrah |
| 8,052,310 B2 | 11/2011 | Gingrich, III |
| 8,066,403 B2 | 11/2011 | Sanfilippo |
| 8,076,683 B2 | 12/2011 | Xu |
| 8,113,680 B2 | 2/2012 | O'Brien |
| 8,118,454 B2 | 2/2012 | Rains, Jr. |
| 8,154,864 B1 | 4/2012 | Nearman |
| 8,172,436 B2 | 5/2012 | Coleman |
| 8,207,546 B2 | 6/2012 | Harada |
| 8,256,930 B2 | 9/2012 | Cheng |
| 8,262,250 B2 | 9/2012 | Li |
| 8,272,758 B2 | 9/2012 | Meir |
| 8,297,788 B2 | 10/2012 | Bishop |
| 8,314,566 B2 | 11/2012 | Steele |
| 8,348,460 B2 | 1/2013 | Bachl |
| 8,371,723 B2 | 2/2013 | Nall |
| 8,434,897 B2 | 5/2013 | Logan |
| 8,434,898 B2 | 5/2013 | Sanfilippo |
| 8,449,128 B2 | 5/2013 | Ko |
| 8,454,193 B2 | 6/2013 | Simon |
| 8,525,190 B2 | 9/2013 | Donofrio |
| 8,545,045 B2 | 10/2013 | Tress |
| 8,552,456 B1 | 10/2013 | Sun |
| 8,575,646 B1 | 11/2013 | Shum |
| 8,598,778 B2 | 12/2013 | Allen |
| 8,616,720 B2 | 12/2013 | Carney |
| 8,676,284 B2 | 3/2014 | He |
| 8,690,368 B1 | 4/2014 | Shipman |
| 8,697,458 B2 | 4/2014 | Nolan |
| 8,702,265 B2 | 4/2014 | May |
| 8,748,202 B2 | 6/2014 | Kwon |
| 8,755,665 B2 | 6/2014 | Hong |
| 8,764,220 B2 | 7/2014 | Chan |
| 8,791,485 B2 | 7/2014 | Ohbayashi |
| 8,820,964 B2 | 9/2014 | Gould |
| 8,858,607 B1 | 10/2014 | Jones |
| 8,876,322 B2 | 11/2014 | Alexander |
| 8,876,325 B2 | 11/2014 | Lu |
| 8,893,144 B2 | 11/2014 | Haham |
| 8,969,894 B2 | 3/2015 | Lee |
| 8,998,448 B2 | 4/2015 | Chang |

(56) References Cited

U.S. PATENT DOCUMENTS

| | | |
|---|---|---|
| 9,016,895 B2 | 4/2015 | Handsaker |
| 9,022,603 B1 | 5/2015 | Moghal |
| 9,052,075 B2 | 6/2015 | Demuynck |
| 9,091,422 B2 | 7/2015 | Greenfield |
| 9,157,622 B2 | 10/2015 | Yanping |
| 9,188,290 B2 | 11/2015 | Lay |
| 9,285,085 B2 | 3/2016 | Carney |
| 9,295,855 B2 | 3/2016 | Jones |
| 9,518,706 B2 | 12/2016 | Chan |
| 9,605,812 B2 | 3/2017 | Van De Ven |
| 9,651,227 B2 | 5/2017 | Pickard |
| 9,666,772 B2 | 5/2017 | Ibbetson |
| 9,713,371 B1 * | 7/2017 | Luu ................ A45D 29/00 |
| 9,722,158 B2 | 8/2017 | Chan |
| 9,874,333 B2 | 1/2018 | Lay |
| 9,976,710 B2 | 5/2018 | Meir |
| 9,995,444 B2 | 6/2018 | Leichner |
| 10,030,828 B2 | 7/2018 | Meir |
| 10,100,988 B2 | 10/2018 | Rodgers |
| 10,132,476 B2 | 11/2018 | Meir |
| 10,228,099 B2 | 3/2019 | Meir |
| 10,378,705 B2 | 8/2019 | Meir |
| 10,465,864 B2 | 11/2019 | Leichner |
| 10,584,860 B2 | 3/2020 | Dungan |
| 10,612,747 B2 | 4/2020 | Rodgers |
| 10,989,372 B2 | 4/2021 | Meir |
| 2002/0114155 A1 | 8/2002 | Katogi |
| 2002/0117692 A1 | 8/2002 | Lin |
| 2003/0058658 A1 | 3/2003 | Lee |
| 2003/0072156 A1 | 4/2003 | Pohlert |
| 2003/0198049 A1 | 10/2003 | Hulse |
| 2003/0223235 A1 | 12/2003 | Mohacsi |
| 2004/0052076 A1 | 3/2004 | Mueller |
| 2004/0070855 A1 | 4/2004 | Benitez |
| 2004/0105261 A1 | 6/2004 | Ducharme |
| 2004/0218386 A1 | 11/2004 | Doll |
| 2005/0092517 A1 | 5/2005 | Fan |
| 2005/0221518 A1 | 10/2005 | Andrews |
| 2005/0225985 A1 | 10/2005 | Catalano |
| 2005/0280016 A1 | 12/2005 | Mok |
| 2005/0286265 A1 | 12/2005 | Zampini |
| 2006/0077687 A1 | 4/2006 | Higashiyama |
| 2006/0134440 A1 | 6/2006 | Crivello |
| 2006/0141851 A1 | 6/2006 | Matsui |
| 2006/0146531 A1 | 7/2006 | Reo |
| 2006/0181903 A1 | 8/2006 | Okuwaki |
| 2006/0187653 A1 | 8/2006 | Olsson |
| 2007/0058377 A1 | 3/2007 | Zampini, II |
| 2007/0064428 A1 | 3/2007 | Beauchamp |
| 2007/0092736 A1 | 4/2007 | Boardman |
| 2007/0103902 A1 | 5/2007 | Hsiao |
| 2007/0205425 A1 | 9/2007 | Harada |
| 2007/0206375 A1 | 9/2007 | Piepgras |
| 2007/0235751 A1 | 10/2007 | Radkov |
| 2007/0279727 A1 | 12/2007 | Gandhi |
| 2008/0048200 A1 | 2/2008 | Mueller |
| 2008/0080196 A1 | 4/2008 | Ruud |
| 2008/0144322 A1 | 6/2008 | Norfidathul |
| 2008/0165530 A1 | 7/2008 | Hendrikus |
| 2008/0212319 A1 | 9/2008 | Klipstein |
| 2008/0239755 A1 | 10/2008 | Parker |
| 2008/0244944 A1 | 10/2008 | Nall |
| 2008/0266900 A1 | 10/2008 | Harbers |
| 2008/0267572 A1 | 10/2008 | Sampsell |
| 2008/0298058 A1 | 12/2008 | Kan |
| 2008/0315228 A1 | 12/2008 | Krames |
| 2009/0021936 A1 | 1/2009 | Stimac |
| 2009/0026913 A1 | 1/2009 | Mrakovich |
| 2009/0109539 A1 | 4/2009 | Devos |
| 2009/0126792 A1 | 5/2009 | Gruhlke |
| 2009/0167203 A1 | 7/2009 | Dahlman |
| 2009/0185389 A1 | 7/2009 | Tessnow |
| 2009/0195168 A1 | 8/2009 | Greenfeld |
| 2009/0225546 A1 | 9/2009 | Pearson |
| 2009/0272996 A1 | 11/2009 | Chakraborty |
| 2009/0310354 A1 | 12/2009 | Zampini, II |
| 2009/0321766 A1 | 12/2009 | Chang |
| 2010/0002414 A1 | 1/2010 | Meir |
| 2010/0008090 A1 | 1/2010 | Li |
| 2010/0033948 A1 | 2/2010 | Harbers |
| 2010/0060157 A1 | 3/2010 | Shi |
| 2010/0060202 A1 | 3/2010 | Melanson |
| 2010/0072488 A1 | 3/2010 | Bierhuizen |
| 2010/0141557 A1 | 6/2010 | Gruhlke |
| 2010/0237766 A1 | 9/2010 | Baumgartner |
| 2010/0246179 A1 | 9/2010 | Long |
| 2010/0254134 A1 | 10/2010 | McCanless |
| 2010/0308354 A1 | 12/2010 | David |
| 2011/0013387 A1 | 1/2011 | Kanade |
| 2011/0025951 A1 | 2/2011 | Jones |
| 2011/0051394 A1 | 3/2011 | Bailey |
| 2011/0051407 A1 | 3/2011 | St Ives |
| 2011/0051425 A1 | 3/2011 | Tsuchiya |
| 2011/0062470 A1 | 3/2011 | Bierhuizen |
| 2011/0089453 A1 | 4/2011 | Min |
| 2011/0122643 A1 | 5/2011 | Spork |
| 2011/0134634 A1 | 6/2011 | Gingrich, III |
| 2011/0136374 A1 | 6/2011 | Mostoller |
| 2011/0164426 A1 | 7/2011 | Lee |
| 2011/0193490 A1 | 8/2011 | Kumar |
| 2011/0198067 A1 | 8/2011 | Hada |
| 2011/0210364 A1 | 9/2011 | Nolan |
| 2011/0222270 A1 | 9/2011 | Porciatti |
| 2011/0255287 A1 | 10/2011 | Li |
| 2011/0280020 A1 | 11/2011 | Chen |
| 2011/0286222 A1 | 11/2011 | Coleman |
| 2011/0303935 A1 | 12/2011 | Chern |
| 2012/0002417 A1 | 1/2012 | Li |
| 2012/0025241 A1 | 2/2012 | Xiao |
| 2012/0025729 A1 | 2/2012 | Melanson |
| 2012/0051048 A1 | 3/2012 | Smit |
| 2012/0051056 A1 | 3/2012 | Derks |
| 2012/0051068 A1 | 3/2012 | Pelton |
| 2012/0087124 A1 | 4/2012 | Ravillisetty |
| 2012/0106152 A1 | 5/2012 | Zheng |
| 2012/0113676 A1 | 5/2012 | Van Dijk |
| 2012/0113678 A1 | 5/2012 | Cornelissen |
| 2012/0140474 A1 | 6/2012 | Jurik |
| 2012/0146066 A1 | 6/2012 | Tischler |
| 2012/0147621 A1 | 6/2012 | Holten |
| 2012/0170303 A1 | 7/2012 | Meir |
| 2012/0218750 A1 | 8/2012 | Klase |
| 2012/0250309 A1 | 10/2012 | Handsaker |
| 2012/0267650 A1 | 10/2012 | Schubert |
| 2012/0286304 A1 | 11/2012 | Letoquin |
| 2013/0021775 A1 | 1/2013 | Veerasamy |
| 2013/0021797 A1 | 1/2013 | Kubo |
| 2013/0021811 A1 | 1/2013 | Goldwater |
| 2013/0063939 A1 | 3/2013 | Kondo |
| 2013/0083524 A1 | 4/2013 | Devorris |
| 2013/0093980 A1 | 4/2013 | Goto |
| 2013/0134445 A1 | 5/2013 | Tarsa |
| 2013/0214691 A1 | 8/2013 | Chen |
| 2013/0249387 A1 | 9/2013 | Hsin |
| 2013/0265750 A1 | 10/2013 | Pickard |
| 2013/0272000 A1 | 10/2013 | Pearson |
| 2013/0274398 A1 | 10/2013 | Shiobara |
| 2013/0292709 A1 | 11/2013 | Tong |
| 2013/0313965 A1 | 11/2013 | Chiang |
| 2014/0001952 A1 | 1/2014 | Harris |
| 2014/0036500 A1 | 2/2014 | Eggleton |
| 2014/0043812 A1 | 2/2014 | Moreau |
| 2014/0112003 A1 | 4/2014 | Lacroix |
| 2014/0168997 A1 | 6/2014 | Lee |
| 2014/0176016 A1 | 6/2014 | Li |
| 2014/0177262 A1 | 6/2014 | Lai |
| 2014/0211448 A1 | 7/2014 | Wang |
| 2014/0268720 A1 | 9/2014 | Dungan |
| 2014/0268748 A1 | 9/2014 | Lay |
| 2014/0268810 A1 | 9/2014 | Marquardt |
| 2014/0334142 A1 | 11/2014 | Levante |
| 2014/0367633 A1 | 12/2014 | Bibl |
| 2015/0003105 A1 | 1/2015 | Goto |
| 2015/0034976 A1 | 2/2015 | Kim |

(56) References Cited

U.S. PATENT DOCUMENTS

| | | |
|---|---|---|
| 2015/0036387 A1 | 2/2015 | Myers |
| 2015/0041839 A1 | 2/2015 | Sakai |
| 2015/0062892 A1 | 3/2015 | Krames |
| 2015/0062965 A1 | 3/2015 | Oh |
| 2015/0117022 A1 | 4/2015 | Meir |
| 2015/0144918 A1 | 5/2015 | Cho |
| 2015/0145406 A1 | 5/2015 | Li |
| 2015/0241034 A1 | 8/2015 | Dankelmann |
| 2015/0252982 A1 | 9/2015 | Demuynck |
| 2015/0276170 A1 | 10/2015 | Motoyanagi |
| 2015/0283768 A1 | 10/2015 | Marquardt |
| 2015/0316219 A1 | 11/2015 | Mallory |
| 2015/0326767 A1 | 11/2015 | Kim |
| 2016/0003424 A1 | 1/2016 | Wu |
| 2016/0035944 A1 | 2/2016 | Spanard |
| 2016/0076741 A1 | 3/2016 | Rong |
| 2016/0076743 A1 | 3/2016 | Deutsch |
| 2016/0093780 A1 | 3/2016 | Beppu |
| 2016/0170120 A1 | 6/2016 | Shani |
| 2016/0195225 A1 | 7/2016 | Carney |
| 2016/0201861 A1 | 7/2016 | Meir |
| 2016/0230958 A1 | 8/2016 | Pickard |
| 2016/0327249 A1 | 11/2016 | Pearson |
| 2016/0327256 A1 | 11/2016 | Hall |
| 2017/0009957 A1 | 1/2017 | Lim |
| 2017/0038015 A1 | 2/2017 | Lunz |
| 2017/0137627 A1 | 5/2017 | Szwarcman |
| 2017/0219170 A1 | 8/2017 | Petluri |
| 2017/0250319 A1 | 8/2017 | Yajima |
| 2017/0256693 A1 | 9/2017 | Yoshizawa |
| 2017/0261186 A1 | 9/2017 | Meir |
| 2017/0261187 A1 | 9/2017 | Meir |
| 2017/0309795 A1 | 10/2017 | Kim |
| 2017/0311422 A1 | 10/2017 | Arai |
| 2017/0343167 A1 | 11/2017 | Petluri |
| 2018/0100959 A1 | 4/2018 | Vasylyev |
| 2018/0113244 A1 | 4/2018 | Vasylyev |
| 2018/0238501 A1 | 8/2018 | Honda |
| 2019/0203889 A1 | 7/2019 | Petluri |
| 2019/0212492 A1 | 7/2019 | Meng |
| 2019/0219251 A1 | 7/2019 | Meir |
| 2019/0267523 A1 | 8/2019 | Min |
| 2019/0338918 A1 | 11/2019 | Ashraf |
| 2019/0383450 A1 | 12/2019 | Meir |
| 2020/0096178 A1 | 3/2020 | Aviram |
| 2020/0098732 A1 | 3/2020 | Meir |
| 2020/0141546 A1 | 5/2020 | Meir |
| 2020/0144468 A1 | 5/2020 | Meir |
| 2020/0158299 A1 | 5/2020 | Meir |
| 2020/0191370 A1 | 6/2020 | Shohat |
| 2021/0338861 A1 | 11/2021 | Harrison |
| 2021/0341134 A1 | 11/2021 | May |
| 2022/0057049 A1 | 2/2022 | Hikmet |

FOREIGN PATENT DOCUMENTS

| | | |
|---|---|---|
| CN | 101614329 | 12/2009 |
| CN | 101714604 A | 5/2010 |
| CN | 201590432 U | 9/2010 |
| CN | 201739849 U | 2/2011 |
| CN | 101997074 A | 3/2011 |
| CN | 202040752 U | 11/2011 |
| CN | 102269351 A | 12/2011 |
| EP | 0592746 B1 | 3/1997 |
| EP | 2256833 B1 | 4/2013 |
| EP | 2474775 B1 | 11/2013 |
| EP | 2484956 B1 | 6/2014 |
| ES | 1211538 U | 5/2018 |
| FR | 3058203 A1 | 5/2018 |
| GB | 2457016 A | 8/2009 |
| JP | 2011508406 T | 3/2011 |
| JP | 2011204495 A | 10/2011 |
| JP | 2011204658 A | 10/2011 |
| KR | 20070039683 | 4/2007 |
| KR | 20090013704 A | 2/2009 |
| KR | 100974942 B1 | 8/2010 |
| KR | 20110106033 | 9/2011 |
| KR | 20120050280 | 5/2012 |
| WO | 0215281 | 2/2002 |
| WO | 2013059298 A1 | 4/2013 |
| WO | 2014082262 A1 | 6/2014 |
| WO | 2014099681 A2 | 6/2014 |
| WO | 2014099681 A3 | 12/2014 |
| WO | 2015066184 A1 | 5/2015 |
| WO | 2018015449 | 1/2018 |
| WO | 2018140727 A1 | 8/2018 |
| WO | 2019193218 A1 | 10/2019 |
| WO | 2019213299 A1 | 11/2019 |
| WO | 2020131933 A1 | 6/2020 |
| WO | 2021021234 A1 | 2/2021 |

OTHER PUBLICATIONS

International Patent Application No. PCT/US2018/015449; Int'l Search Report and the Written Opinion; dated Jun. 14, 2018; 16 pages.

International Patent Application No. PCT/US2019/030252; Int'l Search Report and the Written Opinion; dated Oct. 4, 2019; 13 pages.

International Search Report and Written Opinion for Application No. PCT/US14/62905 dated Jan. 22, 2015, 10 pages.

International Search Report and Written Opinion mailed on Nov. 27, 2013 in PCT Application No. PCT/US2013/045708, 3 pages.

PCT /US2012/060588, "International Application Serial No. PCT/US2012/060588, International Preliminary Report on Patentability and Written Opinion dated May 1, 2014", Ecosense Lighting Inc. et al, 7 Pages.

PCT/US2012/060588, International Application Serial No. PCT/US2012/060588, International Search Report and Written Opinion dated Mar. 29, 2013, Ecosense Lighting Inc. et al, 10 pages.

PCT/US2013/075172, "International Application Serial No. PCT/US2013/075172, International Search Report and Written Opinion dated Sep. 26, 2014", Ecosense Lighting Inc., 16 Pages.

PCT/US2014/062905, International Preliminary Report on Patentability dated May 3, 2016 (7 pp).

PCT/US2014/062905, Written Opinion of the Int'l Searching Authority dated Jan. 22, 2015 (6 pp).

* cited by examiner

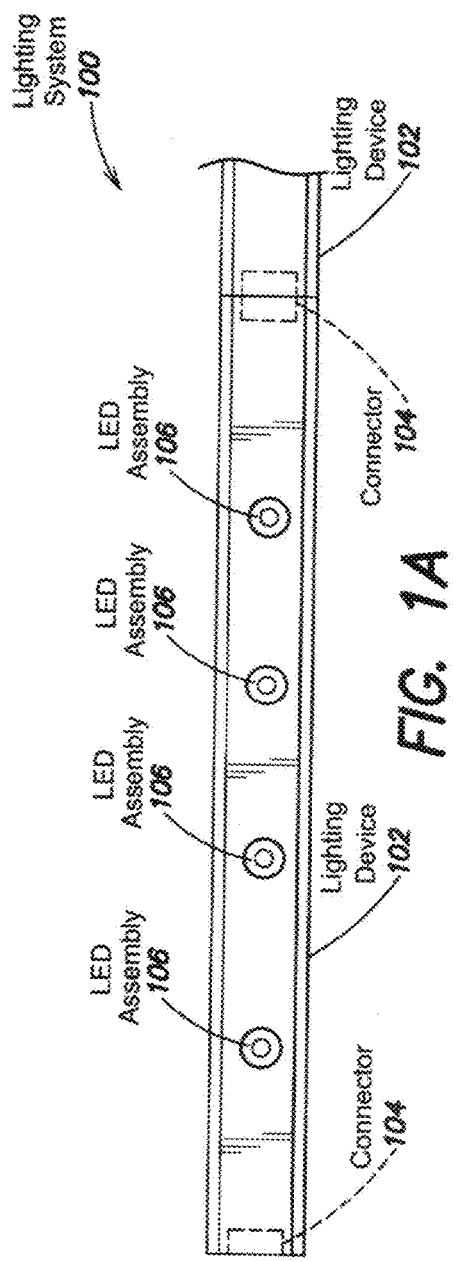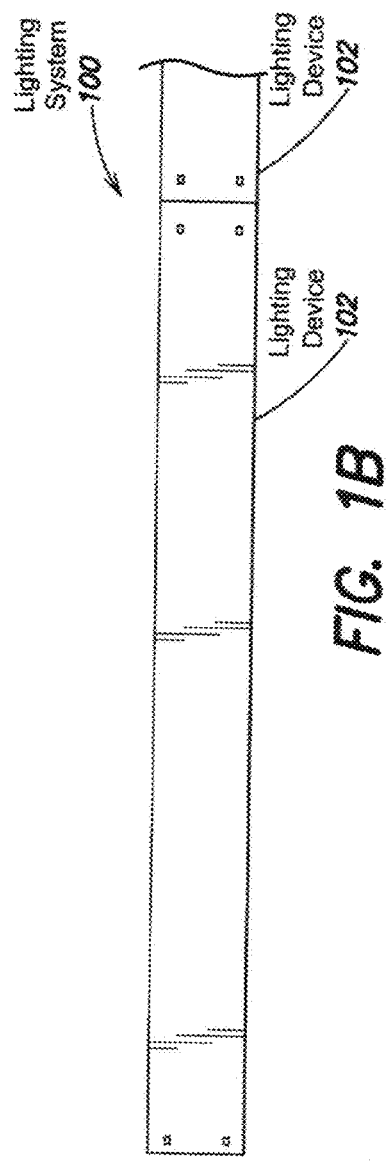

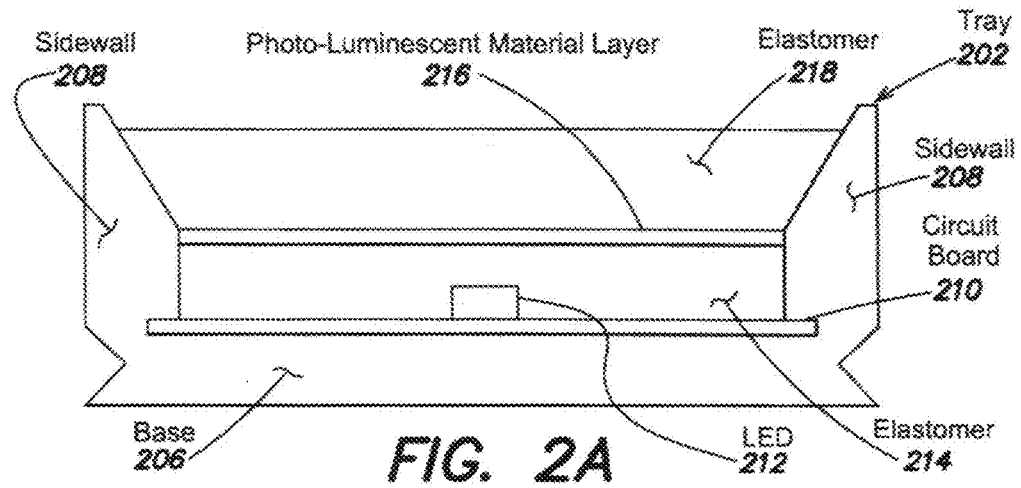
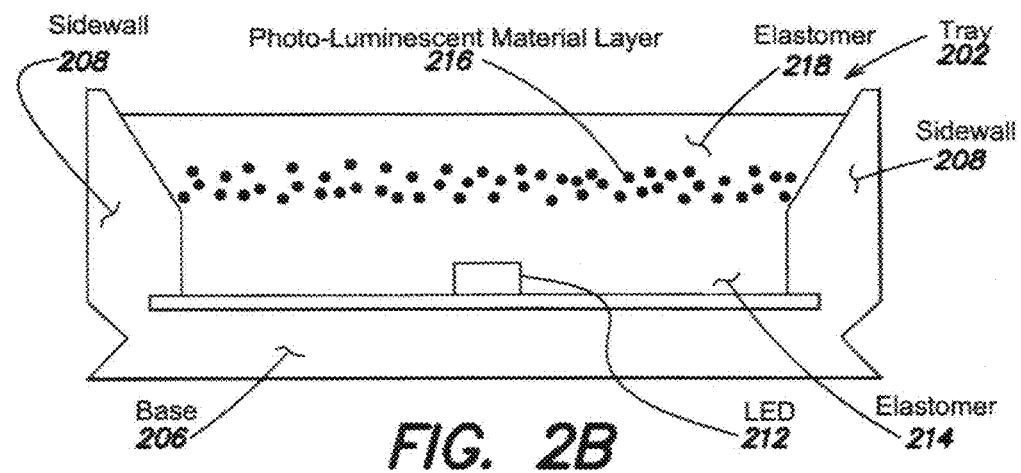
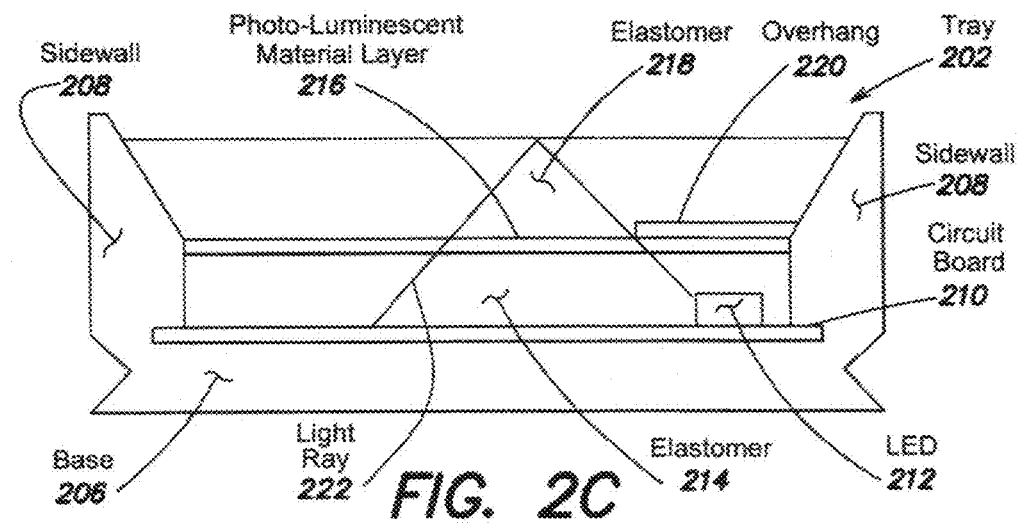

LINEAR LIGHTING SYSTEMS AND PROCESSES

CROSS-REFERENCE TO RELATED APPLICATIONS

This application is a continuation-in-part of copending U.S. patent application Ser. No. 63/511,841 filed on Jul. 3, 2023, titled LINEAR LIGHTING SYSTEMS AND PROCESSES. This application is also a continuation-in-part of copending U.S. patent application Ser. No. 18/303,849 filed on Apr. 20, 2023, titled LIGHTING SYSTEMS WITH HIGH COLOR RENDERING INDEX AND UNIFORM PLANAR ILLUMINATION, which is a divisional of U.S. patent application Ser. No. 17/653,988 filed on Mar. 8, 2022 and issued as U.S. Pat. No. 11,658,163 on May 23, 2023, titled LIGHTING SYSTEMS WITH HIGH COLOR RENDERING INDEX AND UNIFORM PLANAR ILLUMINATION, which is a continuation of U.S. patent application Ser. No. 16/480,867 filed on Jul. 25, 2019 and issued as U.S. Pat. No. 11,296,057 on Apr. 5, 2022 titled LIGHTING SYSTEMS WITH HIGH COLOR RENDERING INDEX AND UNIFORM PLANAR ILLUMINATION, which is a U.S. National Stage patent application based on International Application No. PCT/US2018/015449 filed on Jan. 26, 2018 titled LIGHTING SYSTEMS WITH HIGH COLOR RENDERING INDEX AND UNIFORM PLANAR ILLUMINATION, which claims the benefit under 35 U.S.C. § 119 (e) of U.S. Provisional Application Ser. No. 62/451,612, titled "FLEXIBLE LED LINEAR STRIP" filed on Jan. 27, 2017 and of U.S. Provisional Application Ser. No. 62/451,616, titled "RECESS SLOT LIGHTING" filed on Jan. 27, 2017. Each one of the foregoing patent applications is co-owned by the Applicant herein and is hereby incorporated herein by reference in its entirety.

BACKGROUND OF THE INVENTION

1. Field of the Invention

The present invention relates to the field of linear lighting systems and processes related to such linear lighting systems.

2. Background of the Invention

Numerous linear lighting systems have been developed. Despite the existence of these lighting systems, further improvements are still needed in linear lighting systems and in processes related to such lighting systems.

SUMMARY

In an example of an implementation a linear lighting system is provided, including a tray being extended along elongation directions and having a base forming a bottom interior surface of the tray, a first sidewall extending upward from the base towards an emission aperture of the linear lighting system, and a second sidewall being spaced apart across the base from the first sidewall and extending upward from the base towards the emission aperture of the linear lighting system. In that example, the linear lighting system further includes: a circuit board being located on the first sidewall in the tray; a plurality of light emitting diodes (LEDs) being located on the circuit board and mutually spaced apart on the first sidewall along the elongation directions of the tray and being positioned for light emissions in directions facing toward the second sidewall; and a protuberance being located on the base and interposed between the LEDs and the second sidewall, the protuberance being positioned for diverting light emissions from the plurality of the LEDs toward the emission aperture.

In some examples of the implementation, the tray may be triaxially or biaxially flexible.

In further examples of the implementation, the circuit board may be triaxially or biaxially flexible.

In additional examples of the implementation, the protuberance may include a raised mound located on the base and extending along the elongation directions of the tray, the raised mound being positioned to intersect pathways of some of the light emissions.

In other examples of the implementation, the protuberance may have an angled or convex surface for diverting light emissions toward the emission aperture.

In some examples of the implementation, the convex surface of the protuberance may be smoothly convex.

In further examples of the implementation, the angled surface of the protuberance may have a geometric prismatic shape.

In additional examples of the implementation, the geometric prismatic shape of the protuberance may include a triangular prism, a rectangular prism, a pentagonal prism, or a hexagonal prism.

In other examples of the implementation, the protuberance may include a plurality of raised mounds located on the base and being mutually spaced apart along the elongation directions of the tray, each one of the plurality of the raised mounds being positioned to intersect pathways of some of the light emissions.

In some examples of the implementation, each one of the plurality of the raised mounds may have an angled or convex surface for diverting light emissions toward the emission aperture.

In further examples of the implementation, each one of the convex surfaces of the protuberances may be smoothly convex.

In additional examples of the implementation, each one of the angled surfaces of the protuberances may have a geometric prismatic shape.

In other examples of the implementation, the geometric prismatic shape of each one of the protuberances may include a triangular prism, a rectangular prism, a pentagonal prism, or a hexagonal prism.

In some examples of the implementation, the protuberance may have a highly light reflective surface for reflecting light emissions toward the emission aperture.

In further examples of the implementation, the protuberance may be a light-transmissive protuberance having a higher refractive index than air, for refracting light emissions toward the emission aperture.

In additional examples of the implementation, the linear lighting system may include another circuit board being located on the second sidewall in the tray, and may include a further plurality of light emitting diodes (LEDs) being located on the another circuit board and mutually spaced apart on the second sidewall along the elongation directions of the tray and being positioned for further light emissions in directions facing toward the first sidewall; and the protuberance may be positioned for diverting further light emissions from the further plurality of LEDs toward the emission aperture.

In other examples of the implementation, an interior of the tray may have a highly light reflective surface.

In some examples of the implementation, the linear lighting system may further include a plurality of lenses, each one of the plurality of lenses being located over a respective one of the plurality of the LEDs for increasing a maximum light emission angle of the LED from a first value to a second value that is larger than the first value.

In further examples of the implementation, the linear lighting system may further include a diffuser located over the plurality of the lenses, and the plurality of the lenses and the diffuser may cause the linear lighting system to emit the light emissions as a line of light.

In additional examples of the implementation, the first value of the maximum light emission angle may be no more than about sixty (60) degrees and the second value of the maximum emission angle may be at least about eighty (80) degrees.

In other examples of the implementation, the linear lighting system may include a further plurality of lenses, each one of the further plurality of lenses being located over a respective one of the another plurality of the LEDs for increasing a maximum light emission angle from a first value to a second value that may be larger than the first value.

In some examples of the implementation, the linear lighting system may further include another diffuser located over the further plurality of the lenses, and the further plurality of the lenses and the another diffuser may cause the linear lighting system to emit the further light emissions as a line of light.

In an example of another implementation, a linear lighting system is provided, having a tray being extended along elongation directions and having a base forming a bottom interior surface of the tray, a first sidewall including an angled reflective face and extending upward from the base towards an emission aperture of the linear lighting system, and a second sidewall including a further angled reflective face and extending upward from the base towards the emission aperture of the linear lighting system, the second sidewall being spaced apart across the base from the first sidewall. In the example of the another implementation, the linear lighting system further includes: a circuit board being located on the first sidewall in the tray, and another circuit board being located on the second sidewall in the tray; and a plurality of light emitting diodes (LEDs) being located on the circuit board and mutually spaced apart on the first sidewall along the elongation directions of the tray and being positioned for light emissions in directions facing toward the second sidewall, and another plurality of light emitting diodes (LEDs) being located on the another circuit board and mutually spaced apart on the second sidewall along the elongation directions of the tray and being positioned for further light emissions in directions facing toward the first sidewall; wherein the further angled reflective face of the second sidewall is positioned for reflecting light emissions from the plurality of the LEDs toward the emission aperture; and wherein the angled reflective face of the first sidewall is positioned for reflecting further light emissions from the another plurality of the LEDs toward the emission aperture.

In some examples of the another implementation, the tray may be triaxially or biaxially flexible.

In further examples of the another implementation, the circuit board may be triaxially or biaxially flexible.

In additional examples of the another implementation, the angled reflective face of the first sidewall may be oriented at an acute or obtuse angle relative to the directions of further light emissions toward the first sidewall, and the further angled reflective face of the second sidewall may be oriented at another acute or obtuse angle relative to the directions of the light emissions toward the second sidewall.

In other examples of the another implementation, the angled reflective face of the first sidewall may be oriented at an acute angle of less than about 45 degrees relative to the directions of further light emissions toward the first sidewall, and the further angled reflective face of the second sidewall may be oriented at another acute angle of less than 45 degrees relative to the directions of the light emissions toward the second sidewall.

In further examples of the another implementation, the angled reflective face of the first sidewall may be oriented at an obtuse angle of between about 90 degrees and about 180 degrees relative to the directions of further light emissions toward the first sidewall, and the further angled reflective face of the second sidewall may be oriented at another obtuse angle of between about 90 degrees and about 180 degrees relative to the directions of the light emissions toward the second sidewall.

In some examples of the another implementation, the angled reflective face of the first sidewall may include a reflective bar extended along the elongation directions of the tray and located below the plurality of the LEDs in the tray.

In further examples of the another implementation, the angled reflective face of the first sidewall may include a reflective bar extended along the elongation directions of the tray and located above the plurality of the LEDs in the tray.

In additional examples of the another implementation, the angled reflective face of the first sidewall may be formed by a plurality of reflective rings each encircling a respective one of the plurality of LEDs in the tray.

In other examples of the another implementation, the plurality of the reflective rings may have reflective surfaces being oriented at acute or obtuse angles relative to the directions of further light emissions toward the first sidewall.

In some examples of the another implementation, the further angled reflective face of the second sidewall may be formed by a further plurality of reflective rings each encircling a respective one of the another plurality of LEDs in the tray.

In further examples of the another implementation, the further plurality of reflective rings may have reflective surfaces being oriented at further acute or obtuse angles relative to the directions of light emissions toward the second sidewall.

Other systems, devices, processes, features and advantages of the invention will be or will become apparent to one with skill in the art upon examination of the following figures and detailed description. It is intended that all such additional systems, devices, processes, features and advantages be included within this description, be within the scope of the invention, and be protected by the accompanying claims.

BRIEF DESCRIPTION OF THE DRAWINGS

The invention can be better understood with reference to the following figures. The components in the figures are not necessarily to scale, emphasis instead being placed upon illustrating the principles of the invention. Moreover, in the figures, like reference numerals designate corresponding parts throughout the different views.

FIG. 1A shows a top view of an example linear lighting system, according to some embodiments of the technology described herein;

FIG. 1B shows a bottom view of the example linear lighting system of FIG. 1A, according to some embodiments of the technology described herein;

FIG. 2A shows a cross-sectional view of an example linear lighting system, according to some embodiments of the technology described herein;

FIG. 2B shows a cross-sectional view of another example linear lighting system, according to some embodiments of the technology described herein;

FIG. 2C shows a cross-sectional view of another example linear lighting system, according to some embodiments of the technology described herein;

DETAILED DESCRIPTION

Figure 3:
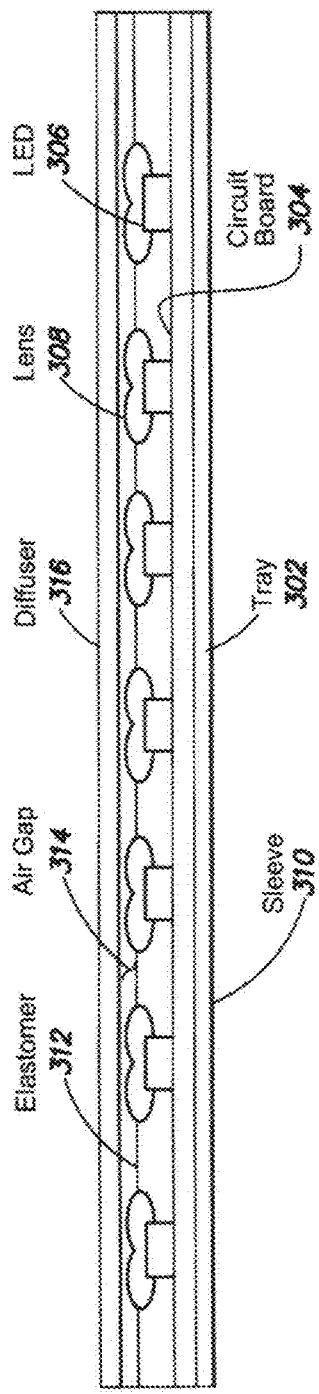
FIG. 3 shows a cross-sectional view of an example linear lighting system with integrated lenses, according to some embodiments of the technology described herein.

Linear lighting systems have been developed for a variety of end-use applications. As examples, linear lighting systems may be installed indoors on walls, ceilings, or floors, and may also be installed on building exteriors. Further, linear lighting systems may be utilized for achieving particular lighting needs, such as lighting for offices, industrial environments, residential kitchens, building exteriors, landscape lighting, and vehicle lighting. In many of these end-use applications and in pursuing many of these particular needs, glare is a significant detraction to such linear lighting systems. Additionally, a line of light may be called for in response to various functional needs such as achieving particular decorative values, or safe working conditions. In some examples, a line of light having substantially uniform intensity may be useful.

According to an example of an implementation of the invention, a linear lighting system is provided including a tray being extended along elongation directions and having a base forming a bottom interior surface of the tray, a first sidewall extending upward from the base towards an emission aperture of the linear lighting system, and a second sidewall being spaced apart across the base from the first sidewall and extending upward from the base towards the emission aperture of the linear lighting system. In that example, the linear lighting system further includes: a circuit board being located on the first sidewall in the tray; a plurality of light emitting diodes (LEDs) being located on the circuit board and mutually spaced apart on the first sidewall along the elongation directions of the tray and being positioned for light emissions in directions facing toward the second sidewall; and a protuberance being located on the base and interposed between the LEDs and the second sidewall, the protuberance being positioned for diverting light emissions from the plurality of the LEDs toward the emission aperture.

According to an example of another implementation of the invention, a linear lighting system is provided having a tray being extended along elongation directions and having a base forming a bottom interior surface of the tray, a first sidewall including an angled reflective face and extending upward from the base towards an emission aperture of the linear lighting system, and a second sidewall including a further angled reflective face and extending upward from the base towards the emission aperture of the linear lighting system, the second sidewall being spaced apart across the base from the first sidewall. In the example of the another implementation, the linear lighting system further includes: a circuit board being located on the first sidewall in the tray; and another circuit board being located on the second sidewall in the tray; and a plurality of light emitting diodes (LEDs) being located on the circuit board and mutually spaced apart on the first sidewall along the elongation directions of the tray and being positioned for light emissions in directions facing toward the second sidewall, and another plurality of light emitting diodes (LEDs) being located on the another circuit board and mutually spaced apart on the second sidewall along the elongation directions of the tray and being positioned for further light emissions in directions facing toward the first sidewall; wherein the further angled reflective face of the second sidewall is positioned for reflecting light emissions from the plurality of the LEDs toward the emission aperture; and wherein the angled reflective face of the first sidewall is positioned for reflecting further light emissions from the another plurality of the LEDs toward the emission aperture.

Inexpensive white LEDs generally are constructed as white phosphor-converted LEDs where a blue LED is covered with a phosphor coating that converts a portion of the blue light from the LED to yellow light so as to create white light. However, these white phosphor-converted LEDs generally emit white light with a low color rendering index (CRI) value because the phosphor coating may allow a substantial portion of the blue light emitted from the LED to remain unconverted. As a result, the white light emitted from such inexpensive LEDs has a large blue component that decreases the CRI value of the white light. Conventionally, the CRI value of the white light emitted by a phosphor-converted LED is improved by adding a red LED that emits red light that mixes with the white light emitted by the phosphor-converted LED to increase the red component of the white light. The increased red component may balance out the large blue component of the white light emitted from the phosphor-converted LED and, thereby, increase the CRI value of the white light.

The inventors have appreciated that the conventional approach to produce white light with a high CRI value is expensive, complex, and inefficient. In particular, pairing the white phosphor-converted LEDs with red LEDs increases the total LED count in a linear lighting system, which increases the total cost of the system and the complexity of the electrical connections between each of the LEDs in the system. Further, the addition of the red LED decreases the power efficiency of the system (e.g., measured in lumens per watt) because the power consumption of the red LED is not balanced out by the small boost to the total lumens provided by the additional red light.

Figure 6:
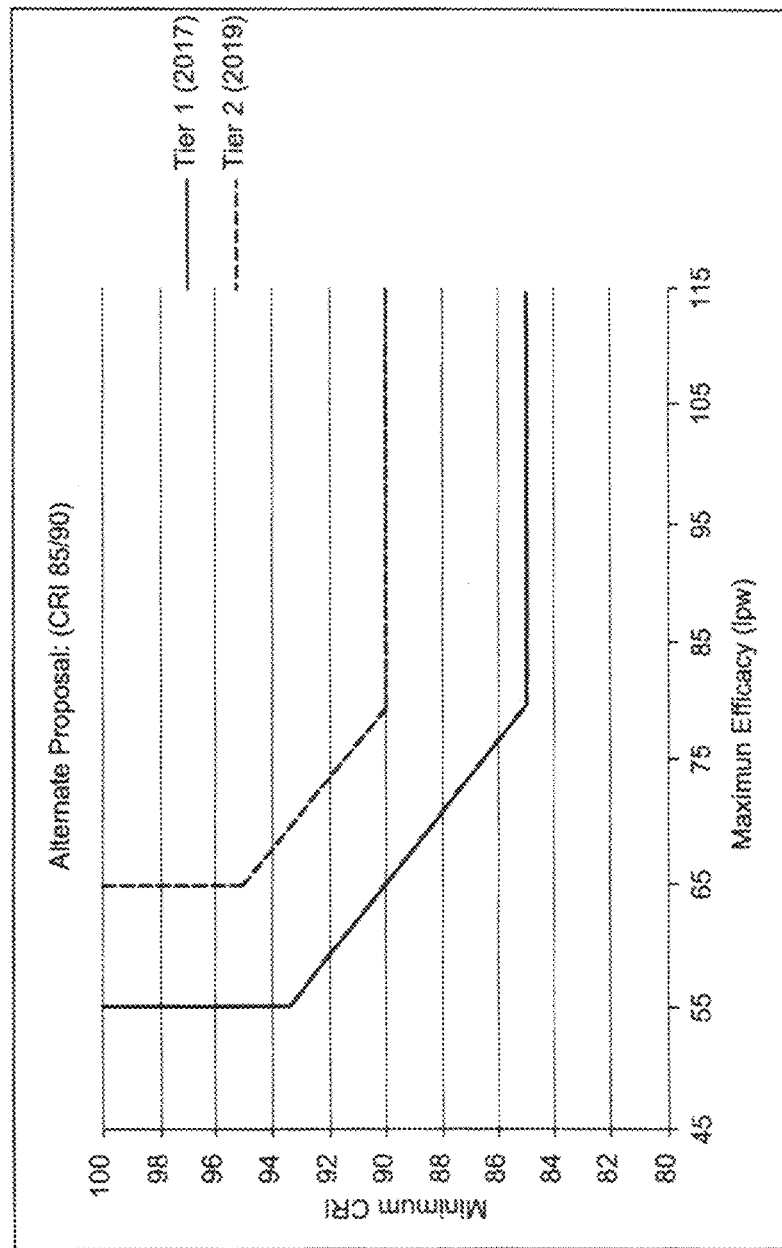
FIG. 6 is a graph showing the power efficiency requirements of high color rendering index (CRI) light sources, according to some embodiments of the technology described herein.

Accordingly, aspects of the present disclosure relate to linear lighting systems that produce broad spectrum light (e.g., white light) with a high CRI value (e.g., a CRI value of at least 95) using only broad spectrum LEDs (e.g., white phosphor-converted LEDs). Thereby, the additional cost, complexity, and power inefficiency created by pairing white phosphor-converted LEDs with red LEDs may be eliminated. Further, the linear lighting systems disclosed herein may have high power efficiency ratings that exceed the present and upcoming standards for linear lighting system power efficiency standards. FIG. 6 shows the power efficiency requirements for linear lighting systems proposed as part of the Codes and Standards Enhancement (CASE) Initiative Program. As shown, the minimum power efficiency for linear lighting systems with a minimum CRI of 95 on sale between 2017 and 2019 is approximately 55 lumens per watt and the minimum power efficiency for linear lighting systems with a minimum CRI of 95 sold in 2019 and thereafter is 65 lumens per watt. The lighting systems described herein may provide high CRI white light with power efficiencies that far exceed these standards. For example, the lighting systems described herein may have power efficiencies in excess of 100 lumens per watt.

In some embodiments, the CRI value of white light emitted by white LEDs (e.g., white phosphor-converted LEDs) is improved through the use of photo-luminescent materials. The photo-luminescent materials may be configured to be emit light in a first spectrum in response to being excited by light in a second different spectrum. For example, the photo-luminescent materials may be configured to absorb blue light and emit light with a longer wavelength (e.g., yellow light, red light, etc.). Thereby, the photo-luminescent materials may reduce the large blue component of the white light emitted by the white phosphor-converted LED and increase the components of light with longer wavelengths (e.g., red light). The resulting white light may have a substantially higher CRI than the white light emitted by the white phosphor-converted LED. Any of a variety of photo-luminescent materials may be employed. Example photo-luminescent material may include a phosphor (e.g., neodymium-doped yttrium aluminum garnet (Nd:YAG)), a silicate, and quantum dots (e.g., Cadmium-free quantum dots). The photo-luminescent material may be an organic material and/or include organic compounds. Additionally (or alternatively), the photo-luminescent material may be an inorganic material and/or include inorganic compounds.

The white LED in combination with the photo-luminescent material may be integrated into a lighting system in any of a variety of ways. In some embodiments, the lighting system may be implemented as an LED linear system including a plurality of interconnected Linear lighting systems. In these embodiments, the Linear lighting systems may include a circuit board onto which an LED may be mounted. The LED may be configured to emit broad spectrum light (e.g., light has a spectrum that is at least 200 nanometers in size such as white light) having a first CRI value. A photo-luminescent material may be disposed between the LED mounted to the circuit board and the top surface of the lighting system to increase the CRI of the broad spectrum light emitted by the LED from the first CRI value (e.g., no more than 80) to a higher, second CRI value (e.g., at least 95). The components of the Linear lighting system may, for example, be partially encapsulated with an elastomer, such as silicone, to protect the components from the environment.

The inventors have additionally appreciated that linear lighting systems are generally unsuitable for direct viewing. In particular, the individual LEDs integrated into the system are generally discernable to a viewer because of their light intensity relative to other locations on the linear lighting system. As a result, linear lighting systems are generally employed in applications where the lighting system is not directly visible. For example, the linear lighting system may be positioned such that only the reflected light from the LEDs can be seen by a viewer.

Aspects of the present disclosure relate to linear lighting systems that provide a line of light along the linear lighting system. In some examples, the linear lighting systems disclosed herein may provide a line of light along the linear lighting system having a substantially uniform intensity. It is understood throughout this specification that the terms "approximately," "about," and "substantially" may be used to mean within ±20% of a target value in some embodiments, within ±10% of a target value in some embodiments, within ±5% of a target value in some embodiments, and yet within ±2% of a target value in some embodiments. The terms "approximately," "about," and "substantially" may include the target value.

These linear lighting systems may be employed in direct view applications, such as in recessed slots, unlike conventional linear lighting systems. The linear lighting systems may be configured to provide a line of light in any of a variety of ways. In some embodiments, a lens may be placed over each LED in the lighting system that increases the maximum emission angle of the light from the LED to improve the distribution of the light. For example, the LED may emit light with a maximum emission angle of no more than ±60 degrees and the lens may increase the maximum emission angle of at least ±80 degrees. Additionally, a diffuser may be employed that diffuses the light from the lenses using any of a variety of materials, such as scattering particles.

The lens in combination with the diffuser may be integrated into a lighting system in any of a variety of ways. In some embodiments, the lighting system may be implemented as a linear lighting system including a plurality of interconnected Linear lighting systems. In these embodiments, the Linear lighting systems may include a tray having a base that is parallel to the bottom surface of the lighting system, a first sidewall that extends from the base towards the top surface of the lighting system, and a second sidewall that extends from the base towards the top surface of the lighting system and is parallel to the first sidewall. A circuit board may be disposed in the tray with an LED mounted thereon that faces the top of the lighting system. A lens may be disposed over the LED that is configured to increase the maximum emission angle of the light from the LED. The linear lighting system may, for example, be partially encapsulated with an elastomer that is in contact with the circuit board, the sidewalls of the tray, and only a portion of the lens such that part of the lens is left exposed (e.g., exposed to air). A diffuser may be disposed above the lens and configured to diffuse the light.

It should be appreciated that the embodiments described herein may be implemented in any of numerous ways. Examples of specific implementations are provided below for illustrative purposes only. It should be appreciated that these embodiments and the features/capabilities provided may be used individually, all together, or in any combination of two or more, as aspects of the technology described herein are not limited in this respect.

Figure 4:
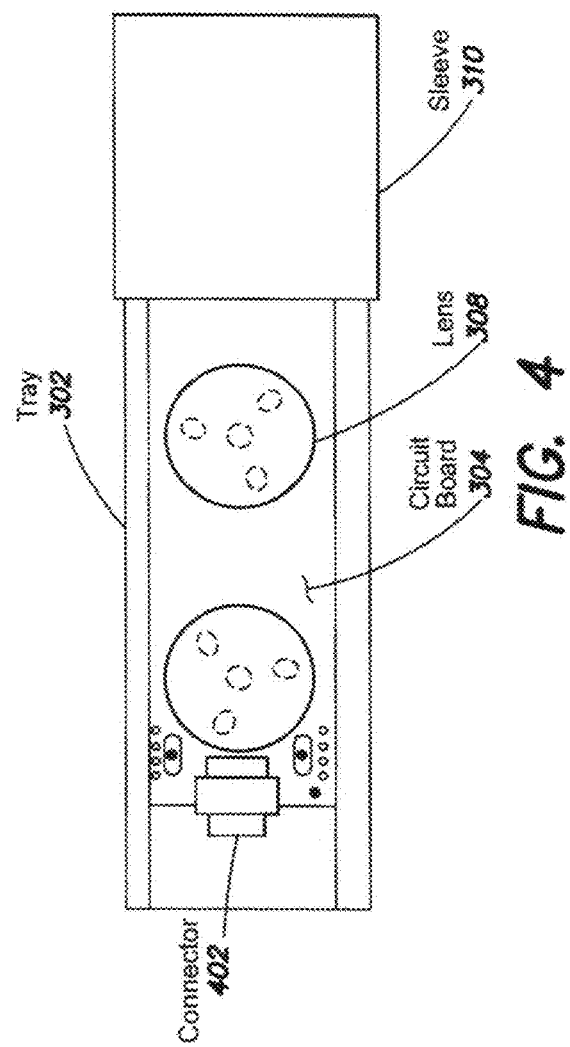
FIG. 4 shows a top view of a deconstructed version of the linear lighting system of FIG. 3, according to some embodiments of the technology described herein.
Figure 5:
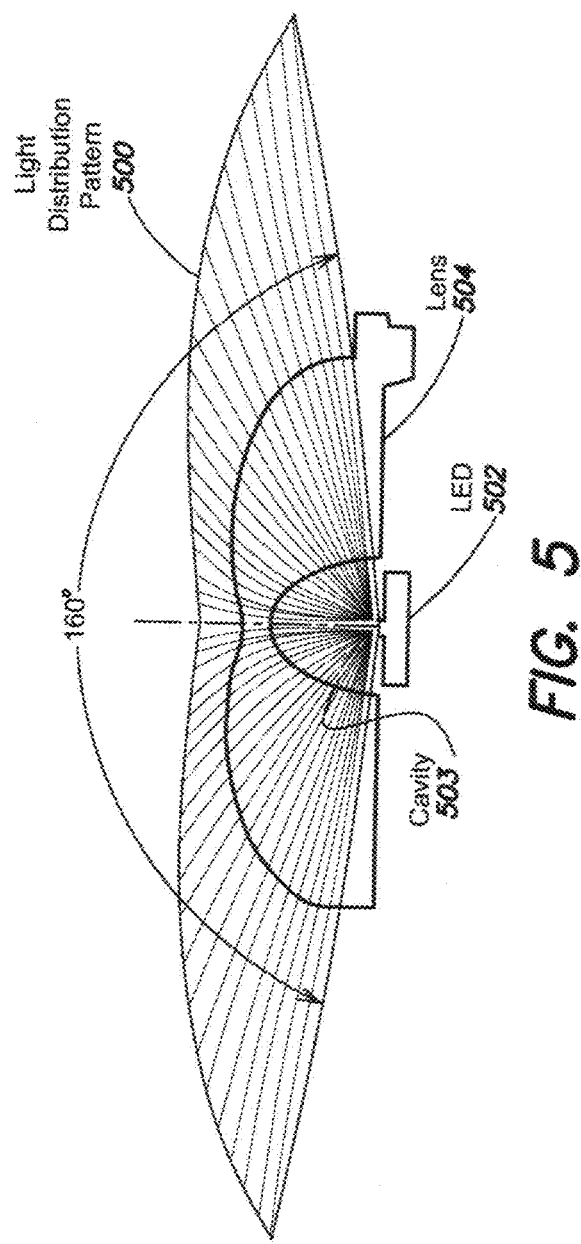
FIG. 5 shows a cross-sectional view of an example lens, according to some embodiments of the technology described herein.
Figure 7:
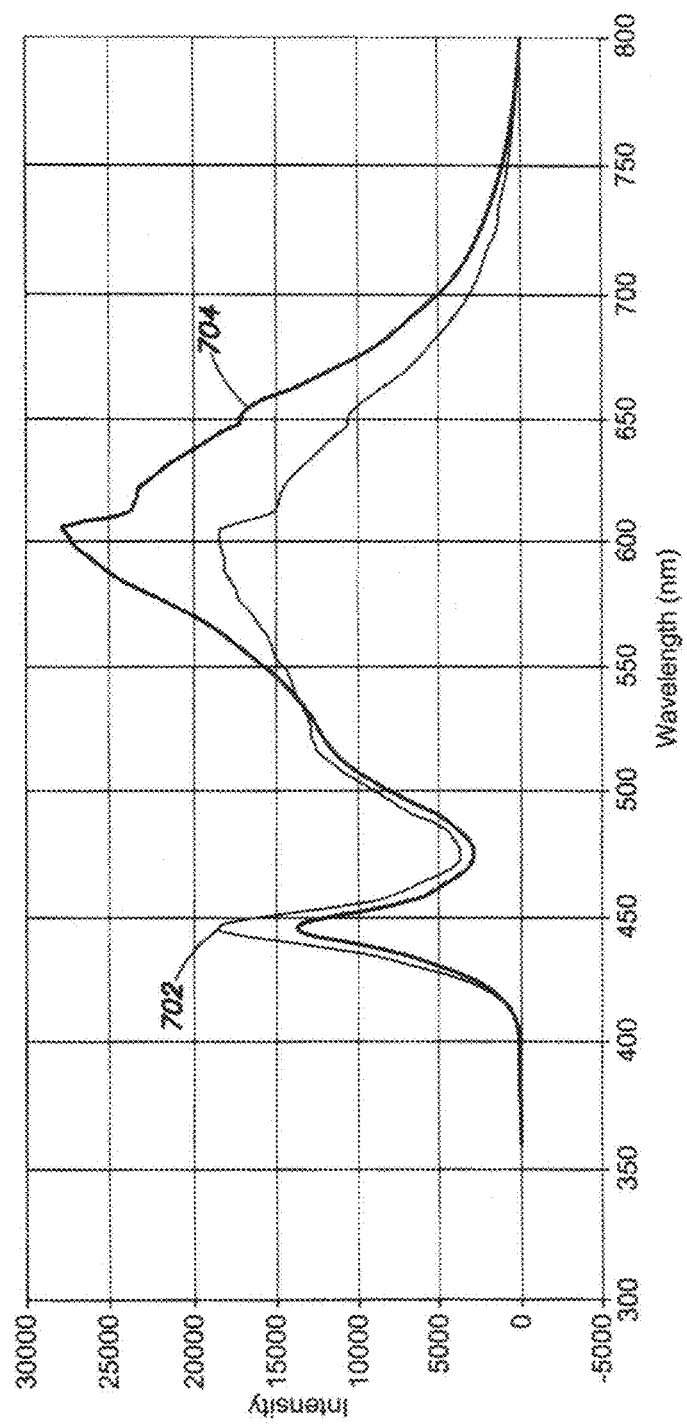
FIG. 7 is a graph showing the spectrum of light emitted by example linear lighting systems with different elastomer configurations, according to some embodiments of the technology described herein.
Figure 8:
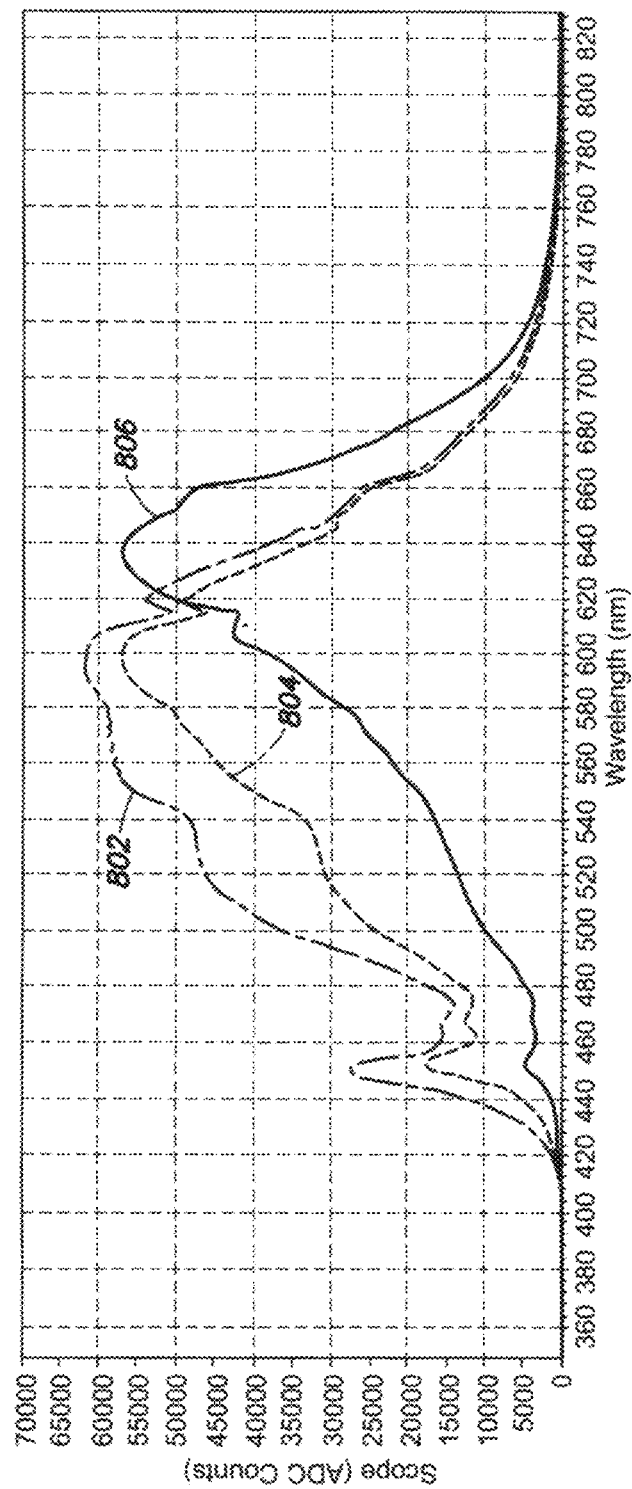
FIG. 8 is a graph showing the spectrum of light emitted by example linear lighting systems with different photoluminescent materials, according to some embodiments of the technology described herein.
Figure 9:
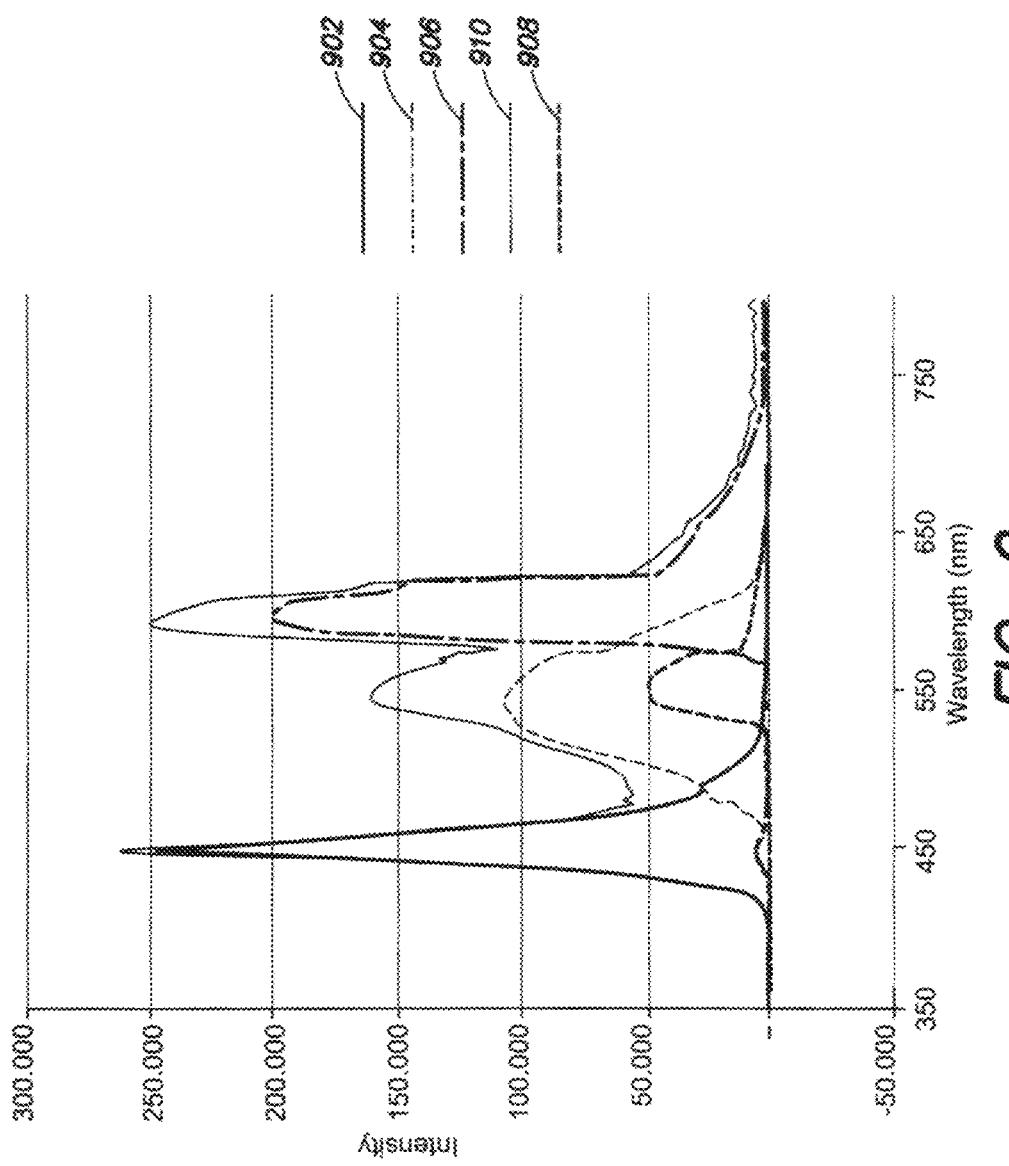
FIG. 9 is a graph showing the spectrum of light emitted by each component of an example linear lighting system for a back lighting unit (BLU), according to some embodiments of the technology described herein.
Figure 10:
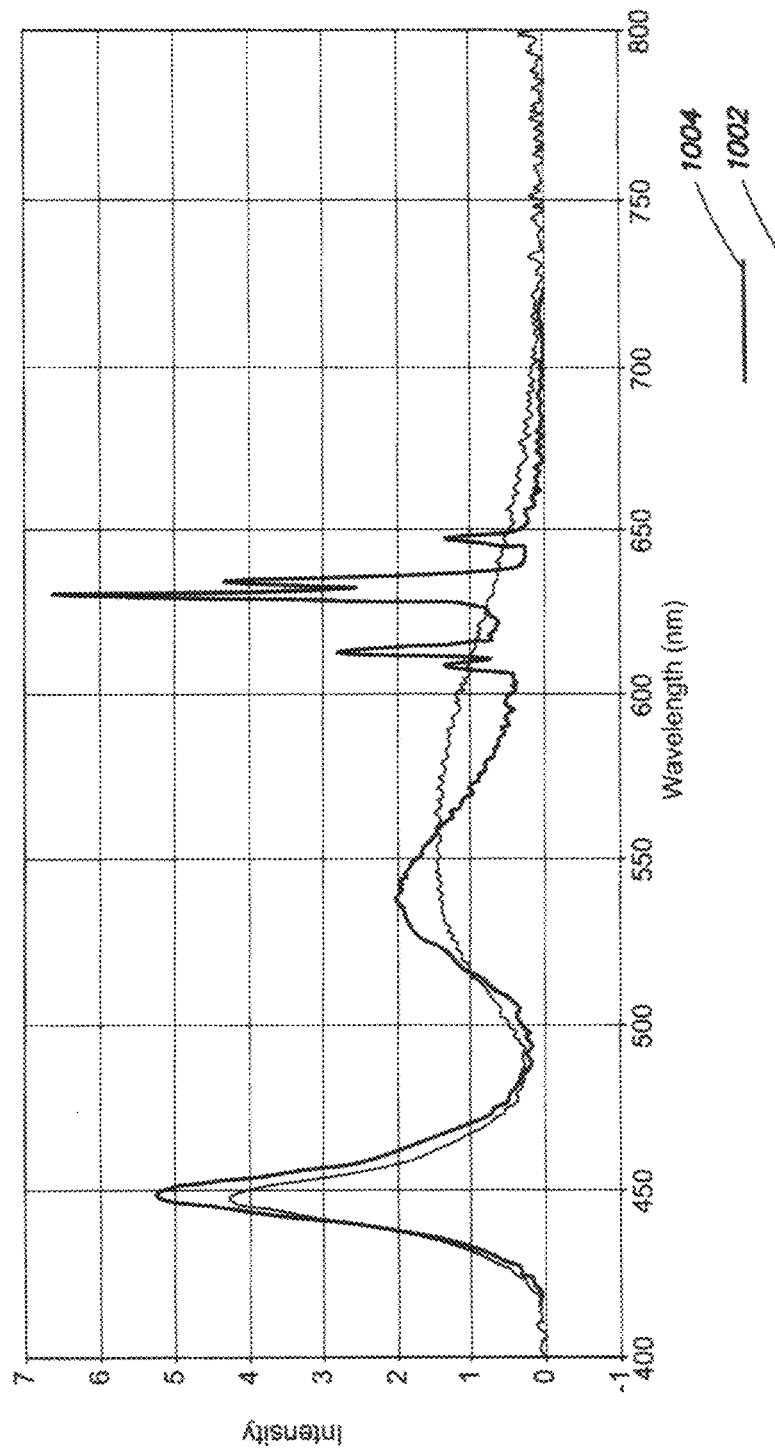
FIG. 10 is a graph showing the spectrum of another example linear lighting system for a BLU, according to some embodiments of the technology described herein.
Figure 11:
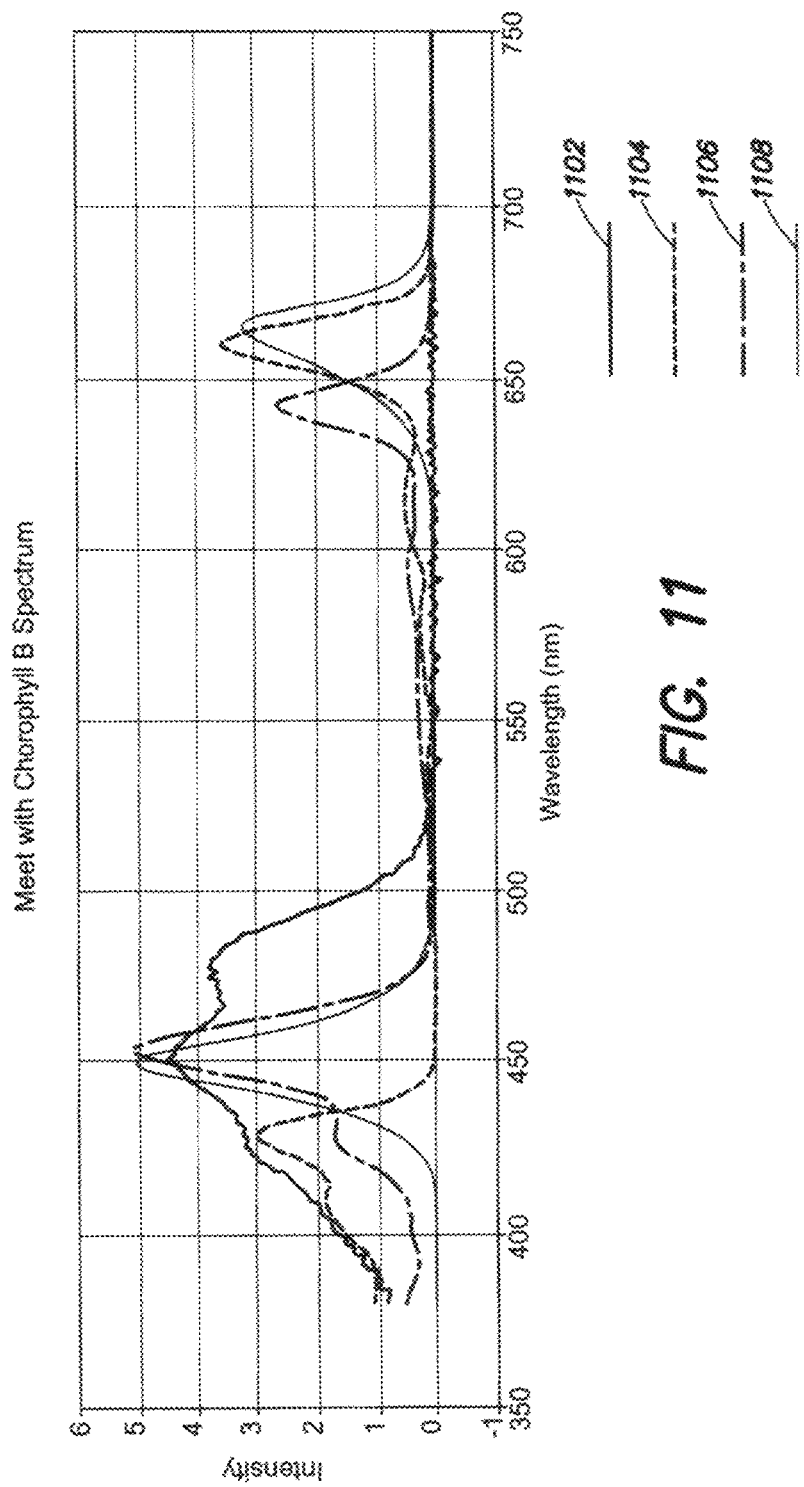
FIG. 11 is a graph showing the spectrum of light emitted by an example linear lighting system compared with the spectrum of light absorbed by different chlorophylls and beta carotene, according to some embodiments of the technology described herein.
Figure 12:
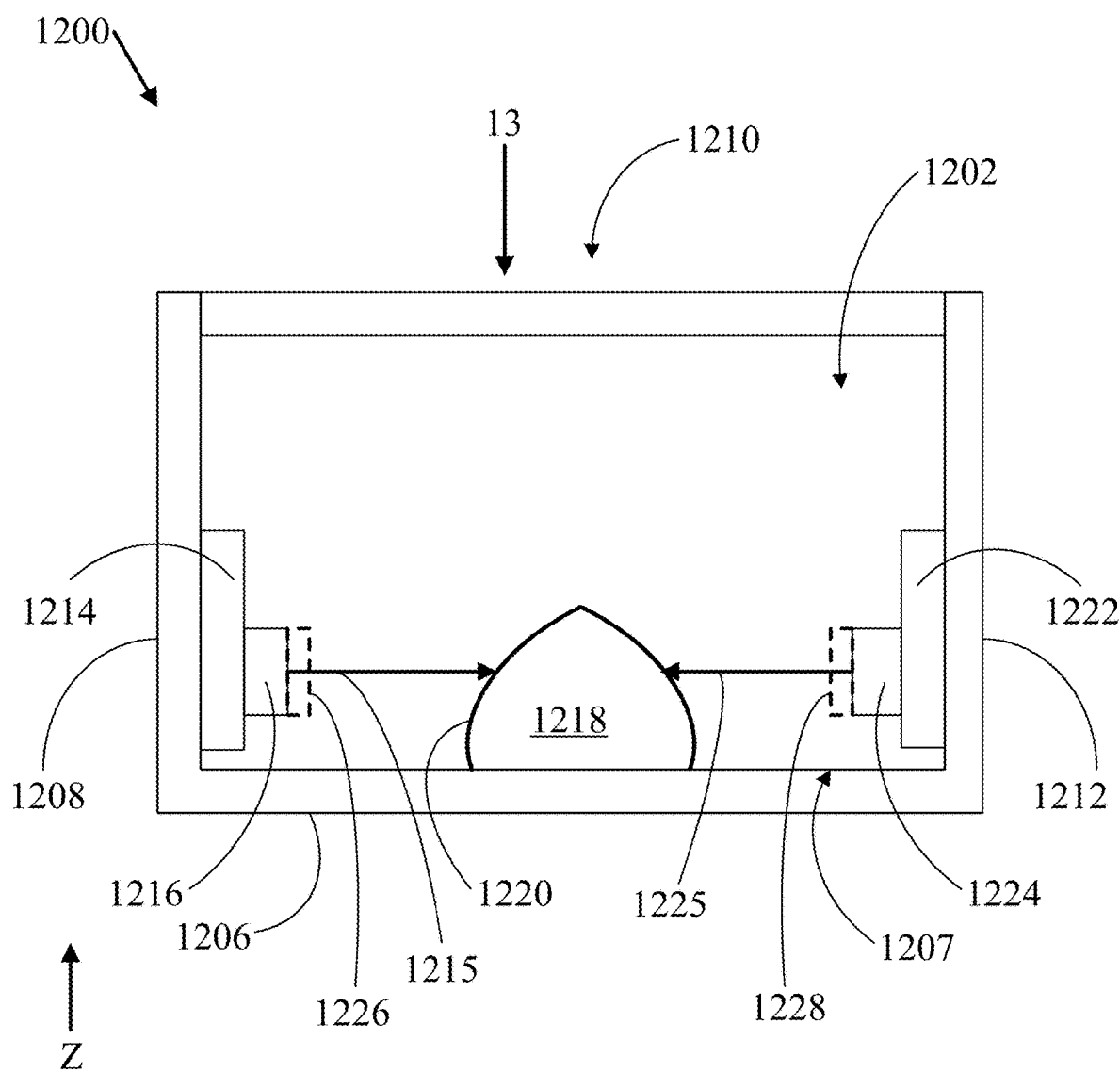
FIG. 12 presents a cross-sectional view of an example of a linear lighting system according to some embodiments of the technology described herein.
Figure 13:
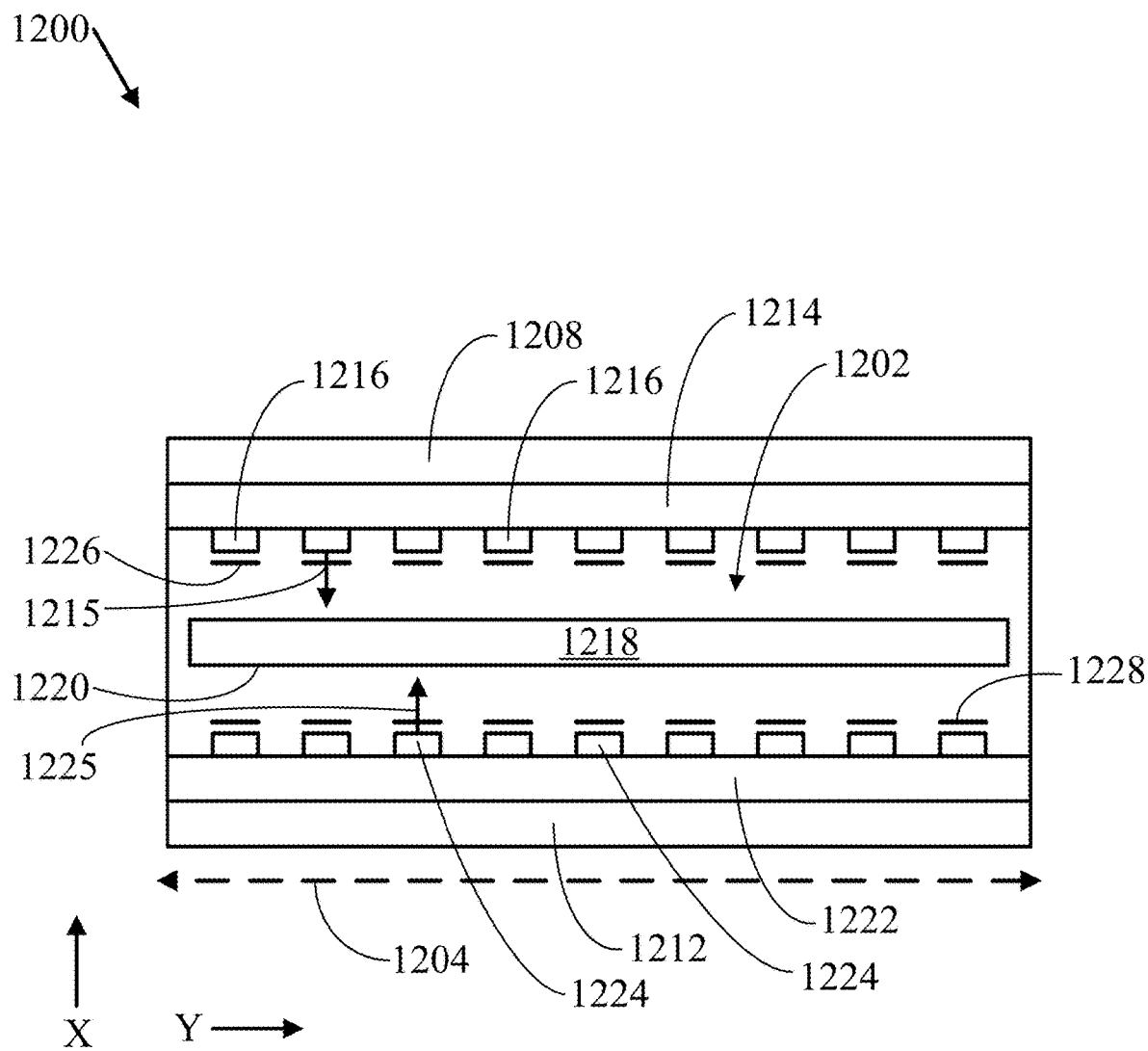
FIG. 13 presents a top view, taken from the direction of the arrow 13, of the example of a linear lighting system shown in FIG. 12.
Figure 14:
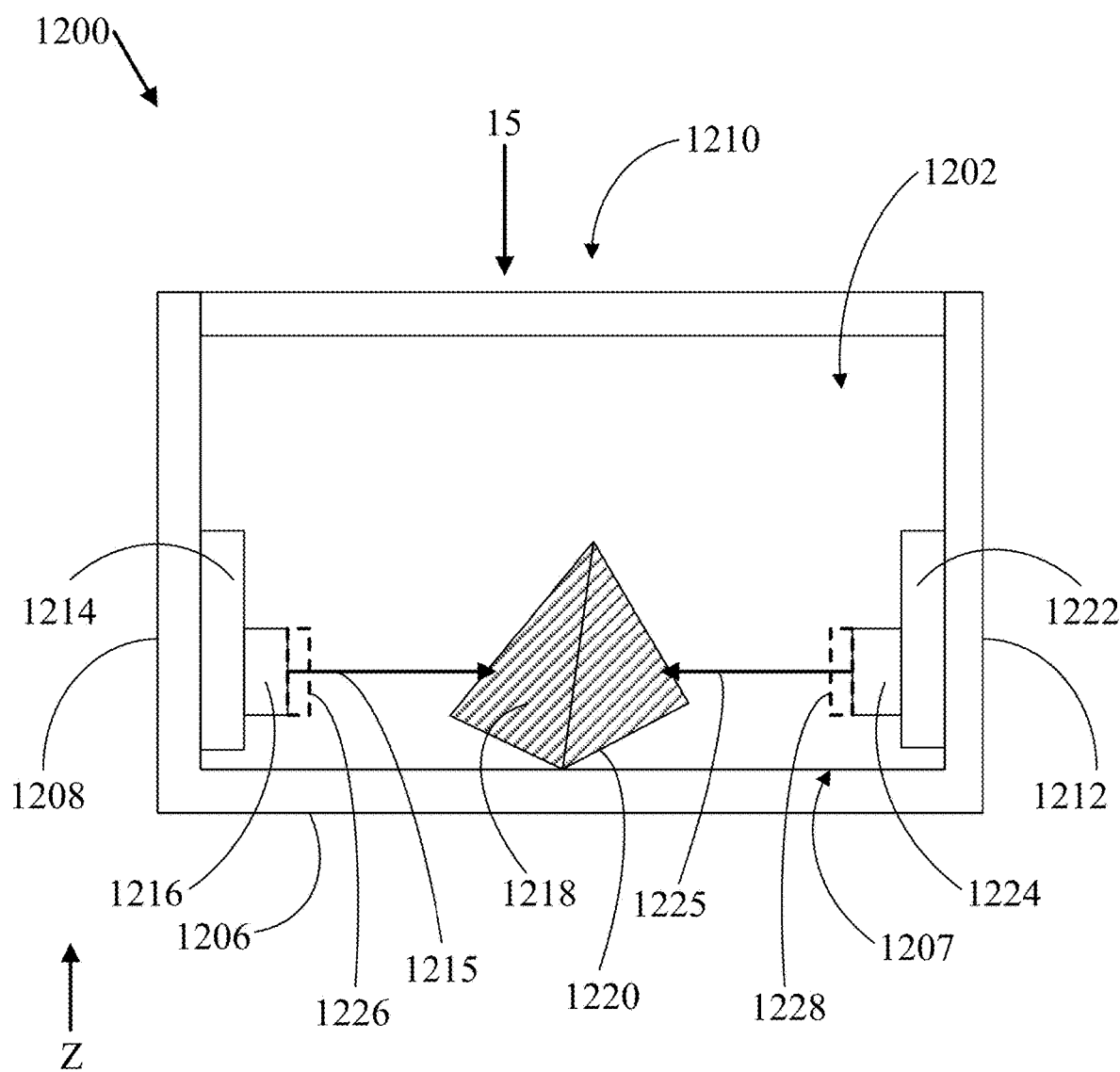
FIG. 14 presents a cross-sectional view of another example of the linear lighting system according to some embodiments of the technology described herein.
Figure 15:
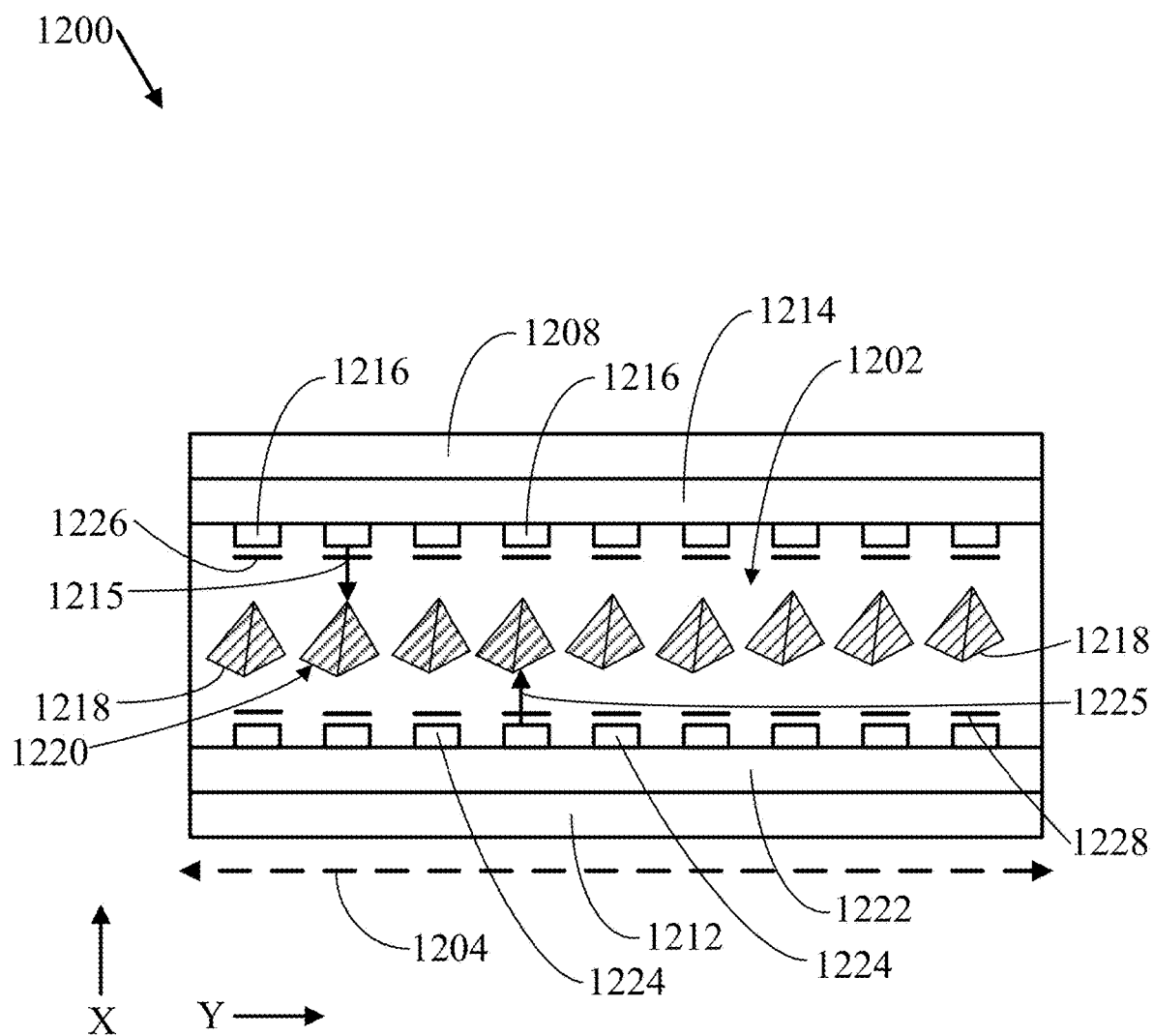
FIG. 15 presents a top view, taken from the direction of the arrow 15, of the another example of the linear lighting system shown in FIG. 14.
Figure 16:
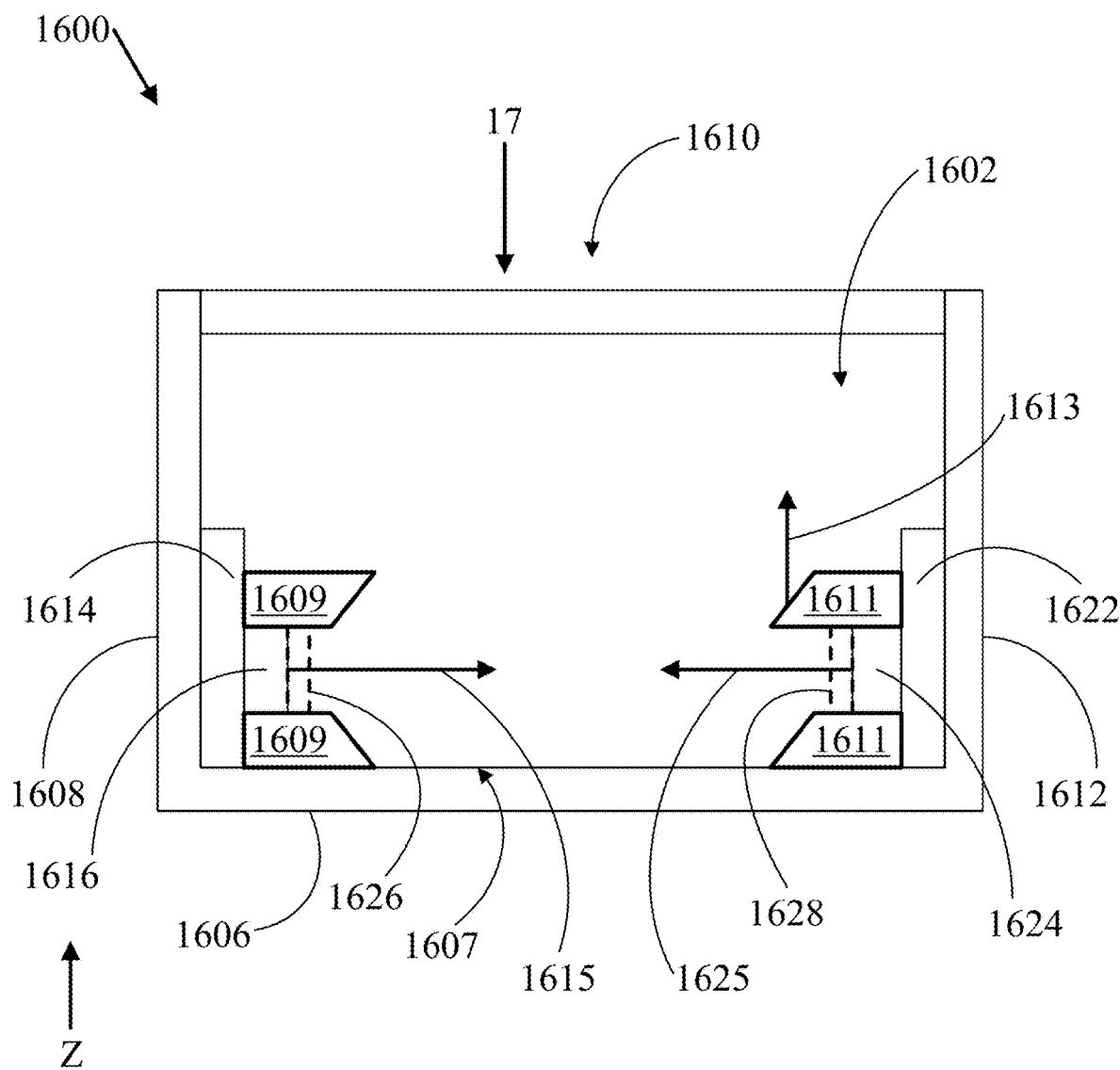
FIG. 16 presents a cross-sectional view of an example of another linear lighting system according to some embodiments of the technology described herein.
Figure 17:
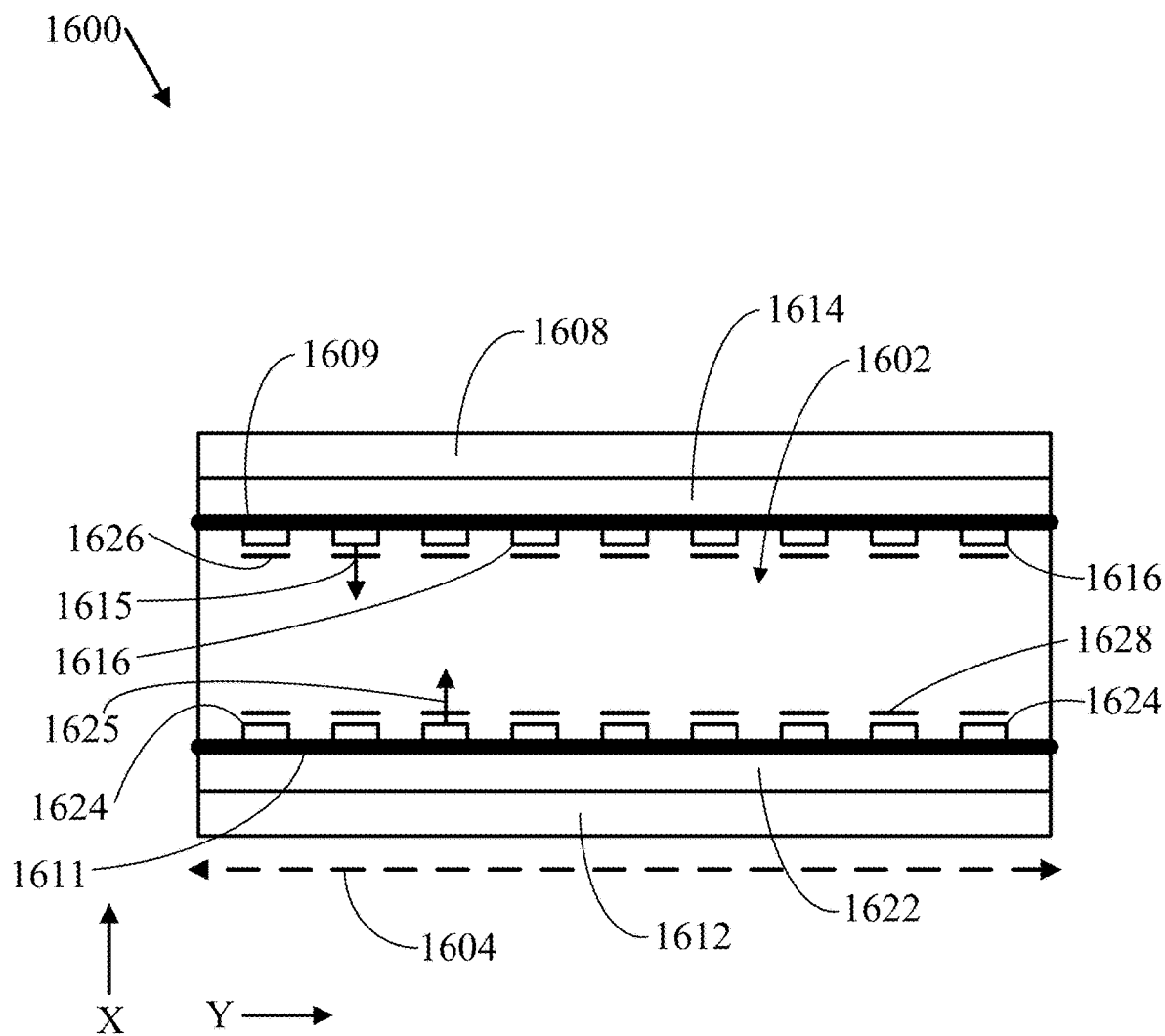
FIG. 17 presents a top view, taken from the direction of the arrow 17, of the example of a linear lighting system shown in FIG. 16.

FIG. 1A shows a top view of an example lighting system, according to some embodiments of the technology described herein. FIG. 1B shows a bottom view of the example lighting system of FIG. 1A, according to some embodiments of the technology described herein. FIG. 2A shows a cross-sectional view of an example lighting system, according to some embodiments of the technology described herein. FIG. 2B shows a cross-sectional view of another example lighting system, according to some embodiments of the technology described herein. FIG. 2C shows a cross-sectional view of another example lighting system, according to some embodiments of the technology described herein. FIG. 3 shows a cross-sectional view of an example lighting system with integrated lenses, according to some embodiments of the technology described herein. FIG. 4 shows a top view of a deconstructed version of the lighting system of FIG. 3, according to some embodiments of the technology described herein. FIG. 5 shows a cross-sectional view of an example lens, according to some embodiments of the technology described herein. FIG. 6 is a graph showing the power efficiency requirements of high color rendering index (CRI) light sources, according to some embodiments of the technology described herein. FIG. 7 is a graph showing the spectrum of light emitted by example lighting systems with different elastomer configurations, according to some embodiments of the technology described herein. FIG. 8 is a graph showing the spectrum of light emitted by example lighting systems with different photo-luminescent materials, according to some embodiments of the technology described herein. FIG. 9 is a graph showing the spectrum of light emitted by each component of an example lighting system for a back lighting unit (BLU), according to some embodiments of the technology described herein. FIG. 10 is a graph showing the spectrum of another example lighting system for a BLU, according to some embodiments of the technology described herein. FIG. 11 is a graph showing the spectrum of light emitted by an example lighting system compared with the spectrum of light absorbed by different chlorophylls and beta carotene, according to some embodiments of the technology described herein. FIG. 12 presents a cross-sectional view of an example of a linear lighting system according to some embodiments of the technology described herein. FIG. 13 presents a top view, taken from the direction of the arrow 13, of the example of a linear lighting system shown in FIG. 12. FIG. 14 presents a cross-sectional view of another example of the linear lighting system according to some embodiments of the technology described herein. FIG. 15 presents a top view, taken from the direction of the arrow 15, of the another example of the linear lighting system shown in FIG. 14. FIG. 16 presents a cross-sectional view of an example of another linear lighting system according to some embodiments of the technology described herein. FIG. 17 presents a top view, taken from the direction of the arrow 17, of the example of a linear lighting system shown in FIG. 16.

Examples [100], [200], [300], [400] of lighting systems are discussed herein in connection with FIGS. 1-11. Examples [1200] of lighting systems are discussed herein in connection with FIGS. 12-15. Examples [1600] of lighting systems are discussed herein in connection with FIGS. 16-17. It is understood throughout this specification that a lighting system [100], [200], [300], [400] may include any of the features or combinations of features that are disclosed in connection with the examples [1200] of lighting systems or the examples [1600] of lighting systems. It is further understood throughout this specification that a lighting system [1200] or [1600] may include any of the features or combinations of features that are disclosed in connection with the Examples [100], [200], [300], [400] of lighting systems. Accordingly, FIGS. 12-17 and the entirety of the discussion of the examples [1200] and [1600] of lighting systems are hereby incorporated into the following discussion of the examples [100], [200], [300], [400] of an implementation of the lighting system.

FIGS. 1A and 1B show top and bottom views, respectively, of an example lighting system 100. As shown, the lighting system 100 is constructed as a linear lighting system that includes a plurality of electrically coupled lighting systems 102. Thereby, the length of the lighting system 100 may be customized by adding (or removing) lighting systems 102. Each of the lighting systems 102 may include LED assemblies 106 mounted to a circuit board that may, for example, be partially encapsulated in an elastomer (e.g., silicone). The LED assemblies 106 may be electrically coupled via the circuit board to connectors 104 mounted on each end of the circuit board. In turn, the connector 104 may electrically couple each LED assemblies 106 to an external system such as another lighting system 102 or a power adapter. The LED assemblies 106 may receive power from the external system via the connector 104 and emit light.

The lighting systems 102 in the lighting system 100 may have particular dimensions to enable a wide range of applications. In some embodiments, the lighting systems 102 may be sized for mounting in recessed slots that are no more than 1 inch deep. In these embodiments, the lighting systems 102 may have, for example, a length of no more than approximately 6 inches, a width of no more than approximately 3 inches, and/or a height of no more than approximately 5⁄8 inches. Thereby, the lighting systems 102 may easily fit within the recessed slots. It should be appreciated that the lighting systems 102 may be constructed with other dimensions.

The LED assemblies 106 may include an LED that is configured to emit light, such as a white phosphor-converted LED. The LED assemblies 106 may (or may not) include additional elements that may change a characteristic of the light emitted by the LED. Example characteristics of the light emitted by the LED that may be changed include: a color correlated temperature (CCT) value, a CRI value, an R9 color index value, and an angle of emission. Any of a variety of elements may be employed to change the characteristics of the light emitted by the LED such as lenses, photo-luminescent materials, and/or scattering particles.

One or more components of the lighting system 102 may be mounted to a circuit board (e.g., a printed circuit board). For example, the LED assemblies 106 and/or the connectors 104 may be mounted to the circuit board. The circuit board may include one or more conductors to electrically couple the components mounted to the circuit board. The circuit board may be flexible to enable the lighting system 102 to bend to conform to uneven surfaces.

The circuit board may, for example, be partially encapsulated in an elastomer, such as a silicone and/or a rubber. The elastomer may insulate the circuit board and/or components mounted to the circuit board, such as the LED assembly 106 and the connector 104, from the external environment. Thereby, the lighting system 100 may be employed in both indoor and outdoor applications.

Each of FIGS. 2A-2C shows a cross-section of an example implementation of the lighting system 102 shown in FIG. 1 that is designed to provide white light with a high CRI. As shown, the lighting system includes a tray 202 that is configured to receive a circuit board 210 with an LED 212 mounted thereon. An elastomer 214 may, for example, be potted over the circuit board 210 to partially encapsulate the circuit board 210 and secure the circuit board 210 to the lighting system. A photo-luminescent material layer 216 is disposed on top of the elastomer 214 and may be configured to change a characteristic of the light emitted by the LED 212 such as CRI, R9 color rendering value, and/or CCT. Another elastomer 218 may be potted over the photo-luminescent material layer 216 to separate the photo-luminescent material layer 216 from the environment.

The tray 202 may include a base 206 onto which the circuit board 210 may be disposed and sidewalls 208 that extend upward from the base 206. It is understood throughout this specification that the term "upward" denotes an orientation of a sidewall relative to a base. The sidewalls 208 may be parallel to each other and/or perpendicular to the base 206. The base 206 may form a bottom surface of the lighting system while the sidewalls 208 may form the lateral surfaces of the lighting system. The tray 202 may be constructed from any of a variety of materials. For example, the tray 202 may be constructed from an elastomer such as silicone. In this example, the elastomer may be manufactured through an extrusion process (e.g., a silicone extrusion process). The elastomer employed to construct the tray 202 may be different from the elastomers 214 and/or 218. For example, the elastomer in the tray 202 may be more porous than the elastomers 214 and/or 218 to provider greater heat dissipation capability to dissipate heat from the circuit board 210 and/or the LED 212.

In some embodiments, the tray 202 may include an overhang 220 that extends from one of the sidewalls 208 towards another sidewall 208 as shown in FIG. 2C. The overhang 220 may be parallel to the base 206. In these embodiments, the LED 212 may be mounted to the circuit board 210 at a location that is under the overhang 220. Thereby, the LED 212 may be obscured from view. Further, the overhang 220 may be long enough such that the light ray 222 emitted at the maximum emission angle of the LED 212 does not directly leave the lighting system. Instead, the light ray 222 may reach the top surface of the elastomer 218 at such an angle that the light ray 222 is reflected back from the top surface (e.g., because the angle is above the critical angle for total internal reflection (TIR)). Thereby, the light emitted by the LED 212 may be reflected off of a surface in the lighting system before leaving the top surface of the elastomer 218.

The circuit board 210 may be configured to electrically couple the LED 212 to one or more other components. For example, the circuit board may include conductors that electrically couple the LED 212 to a connector mounted to the circuit board (e.g., connector 204 in FIG. 1A). The circuit board 210 may be, for example, an FR4 printed circuit board (PCB). Additionally (or alternatively), the circuit board may be a flexible circuit board 210 to permit the lighting system to bend without breaking.

The LED 212 may be configured to emit broad spectrum light, such as light with a spectrum that is at least 200 nanometers (nm) in size (e.g., 200 nm, 225 nm, 250 nm, 275 nm, 300 nm, etc.). The broad spectrum light may be, for example, white light. The LED 212 may be construed in any of a variety of ways to generate the broad spectrum light. For example, the LED 212 may be constructed as a white phosphor-converted LED. It should be appreciated that the LED 212 may be configured to emit narrow spectrum light in some embodiments, such as light with a spectrum that is less than 200 nm in size. For example, the LED 212 may be constructed as a blue LED without a phosphor coating.

The elastomer 214 may be potted over the circuit board 210 to hold the circuit board 210 in-place in the lighting system. The elastomer 214 may, in some embodiments, be in direct contact with the LED 212. Allowing the elastomer 214 to be in direct contact with the LED 212 may, for example, change the spectrum of the light emitted by the LED 212 because the elastomer 214 may have a refractive index that is higher than air (e.g., a refractive index of approximately 1.5). FIG. 7 shows the difference between the spectrums of the light emitted from the LED 212 when the light is emitted directly into elastomer 214 instead of air. In particular, a first line 702 shows the spectrum of light from the LED 212 that is emitted directly into elastomer 214 and a second line 704 shows the spectrum of light from the LED 212 that is emitted directly into air. As shown, the blue component between approximately 425 nm and 475 nm of the light from the LED 212 is substantially increased when the light is emitted directly into the elastomer 214. The additional blue component of the light from the LED 212 may be advantageously employed to excite photo-luminescent materials in the photo-luminescent material layer 216. Thereby, the blue component of the light from the LED 212 may be converted into light with longer wavelengths, such as yellow and/or red light, by the photo-luminescent material layer 216.

The photo-luminescent material layer 216 may include one or more photo-luminescent materials that are configured to emit light in a first spectrum in response to being excited by light in a second different spectrum. For example, the photo-luminescent materials may be configured to absorb light with a shorter wavelength, such as blue light, and emit light with a longer wavelength, such as yellow and/or red light. The particular photo-luminescent materials and their respective proportions in the photo-luminescent material layer 216 may depend on, for example, the desired spectrum of light to be generated by the lighting system. Example photo-luminescent materials include a phosphor (e.g., neodymium-doped yttrium aluminum garnet (Nd: YAG)), a silicate, and a quantum dot (e.g., a Cadmium free quantum dot). The photo-luminescent material may be an organic material and/or include organic compounds such as any of the color conversion materials described in U.S. Patent Publication No. 2017/0137627. Additionally (or alternatively), the photo-luminescent material may be an inorganic material and/or include inorganic compounds.

The photo-luminescent material layer 216 may be constructed in any of a variety of ways. For example, the photo-luminescent material layer 216 may be formed as a sheet (e.g., as a foil) that is sandwiched between elastomer 214 and 218 and includes a set of one or more photo-luminescent materials as shown in FIGS. 2A and 2C. In another example, the photo-luminescent material layer 216 may be constructed as a plurality of separate elements (e.g., separate circular sheets) that are each disposed over an LED on the circuit board 210. Thereby, the separate elements may be uniquely configured for the specific LED that the respective element is disposed over (e.g., a first element with a first composition may be disposed over a first LED and a second element with a second, different composition may be disposed over a second, different LED). In yet another example, the photo-luminescent material layer 216 may include a set of one or more photo-luminescent materials distributed through a polymer (e.g., silicone) that is sandwiched between elastomer 214 and 218 as shown in FIG. 2B.

FIG. 8 shows the changes to the light spectrum that may be created by the photo-luminescent materials in the photo luminescent layer 216. In particular, a first line 802 shows the spectrum of light from a white phosphor-converted LED without any change from a photo-luminescent material, a second line 804 shows the spectrum of light from the white phosphor-converted LED after passing through a first quantum dot material, and a third line 806 shows the spectrum of light from the white phosphor-converted LED after passing through a different, second quantum dot material. A summary of the changes in the spectrum caused by each of the first and second quantum dot materials is shown in Table 1 below:

TABLE 1

| Element in FIG. 8 | Light Source | CCT | CRI | R9 |
|---|---|---|---|---|
| 802 | No photo-luminescent material | 4000 | 86 | 25 |
| 804 | First Quantum Dot material | 3300 | 91 | 45 |
| 806 | Second Quantum Dot material | 2000 | 96 | 80 |

As shown, the first quantum dot material increases the CRI, CCT, and R9 color rendering value of the white light by reducing the blue component of the white light and the second quantum dot material further increases the CRI, CCT, and R9 color rendering value of the white light by further reducing the blue component of the white light in addition to increasing the red component of the white light.

The composition of the photo-luminescent material layer 216 may be customized to achieve a desired light spectrum for any of a variety of different applications. For example, the photo-luminescent material layer 216 may be designed to provide light suitable for black light units (BLUs) in display applications. In this example, the LED 212 may be configured to emit narrow spectrum light (e.g., blue light) and the photo-luminescent material layer 216 may be configured to absorb some of the blue light and, in turn, emit light with a longer wavelength (e.g., green, yellow, orange, and/or red light). FIG. 9 shows the spectrum of light emitted by each component of such a lighting system that employs a red quantum dot material, a green quantum dot material, and yellow green (e.g., CIE Color Coordinates of x=3.14 and y=0.584) phosphor material in the photo-luminescent material layer 216. The ratio of the red quantum dot material to the green quantum dot material may be 80:20 (i.e., there are 80 parts of red quantum dot material for every 20 parts of green quantum dot material). In FIG. 9, line 902 shows the spectrum of light from a blue LED, line 904 shows the spectrum light from the yellow green phosphor material, line 906 shows the spectrum of light emitted by the excited red quantum dot material, line 908 shows the spectrum of light emitted by the excited green quantum dot material, and line 910 that shows the resulting spectrum of the lighting system (e.g., a combination of the spectrums of the blue LED, the phosphor, the red quantum dot material, and the green quantum dot material). Other combinations of materials may be employed to achieve a similar spectrum. For example, the green quantum dot material may be removed entirely and replaced with additional red quantum dot material. Thereby, the photo-luminescent layer 216 may omit the green quantum dot material altogether.

The photo-luminescent material layer 216 for a lighting system being employed in BLUs where the LED 212 emits light with a broad spectrum (instead of a narrow spectrum) may be designed differently. FIG. 10 shows the spectrum of another example lighting system suitable for a BLU that is constructed using a broad spectrum LED. In particular, line 1002 shows the light spectrum of a white phosphor-converted LED formed from a blue LED coated in a yellow phosphor coating and line 1004 shows the light spectrum of a white phosphor-converted LED formed from a blue LED coated in a red phosphor coating paired with a photo-luminescent material in the photo-luminescent material layer 216 that is configured to absorb some of the blue light and emit green light. As shown, the light spectrum of the light from the phosphor-converted LED and photo-luminescent material layer 216 produces light with a warmer color temperature than employing the white phosphor-converted LED alone.

As should be appreciated from the foregoing description, the spectrum of a lighting system may be adjusted to achieve a desired light spectrum by varying the types and/or concentrations of photo-luminescent materials in the photo-luminescent material layer 216. For example, the red component of the light emitted by the lighting system may be increased by adding a red quantum dot material to the photo-luminescent material layer 216. Thereby, the lighting system described herein may be employed to create light for any of a variety of applications.

In some embodiments, the composition of the photo-luminescent material layer 216 may be designed for grow light applications. Thereby, the lighting systems described herein may be constructed as grow lights configured to stimulate plant growth. In these embodiments, the spectrum of the light generated by the lighting system may, for example, closely match the spectrum of light absorbed by plants. Such a spectrum may be achieved by, for example, selecting a narrow spectrum LED that emits light with a wavelength below 500 nm (e.g., a blue LED) or a broad spectrum LED that emits a substantial portion light with a wavelength below 500 nm (e.g., a phosphor-converted white LED) for the LED 212 and adding photo-luminescent materials to the photo-luminescent material layer 216 that absorb some of the light below 500 nm from the LED and emit orange and/or red light (e.g., light with a spectrum between 600 nm and 700 nm). Further, the LED 212 may be in direct contact with the elastomer 214 to increase the component of short wavelength light (e.g., light with a wavelength below 500 nm) as described above with reference to FIG. 7. FIG. 11 shows the spectrum of light emitted by an example grow light compared with the spectrum of light absorbed by different chlorophylls and beta carotene. In particular, line 1102 shows the spectrum of light absorbed by beta carotene, line 1104 shows the spectrum of light absorbed by chlorophyll A, line 1106 shows the spectrum of light absorbed by chlorophyll B, and line 1108 shows the spectrum of light the example grow light. As shown, the spectrum of the light from the example grow light closely approximates the light absorbed by chlorophyll A and chlorophyll B. Further, the spectrum includes little light in portions of the spectrum that a plant would not absorb (e.g., between 525 and 600 nm) to improve the power efficiency of the grow light.

As should be appreciated from the foregoing, the photo-luminescent material layer 216 may include any of a variety of photo-luminescent materials. Further, the particular composition of the photo-luminescent material layer 216 may vary based on the desired light spectrum, which may vary based on the particular application.

Returning to FIGS. 2A-2C, the photo-luminescent material layer 216 may be covered by the elastomer 218. The elastomer 218 may be, for example, silicone. The elastomer 218 may have the same or different characteristics, such as refractive index, relative to the elastomer 214. For example, the elastomer 218 may have a different (e.g., higher or lower) refractive index than the elastomer 214.

It should be appreciated that photo-luminescence materials may be integrated into portions of the lighting system separate from the photo-luminescence material layer 216. For example, the elastomer 218 and/or the elastomer 214 may include a photo-luminescence material such as a phosphor. Additionally (or alternatively), other materials separate from photo-luminescence materials, such as scattering particles and/or pigments, may be integrated into any of the following components of the lighting system: the elastomer 214, the elastomer 218, the photo-luminescence material layer 216, and/or the tray 202.

The lighting system shown in FIGS. 2A-2C may be manufactured in any of a variety of ways. The lighting system may be manufactured by, for example, performing the following steps: (1) mounting the electronic components (e.g., the LED 212) to the circuit board 210; (2) inserting the circuit board into the tray 202; (3) potting the elastomer 214 over the circuit board 210 in the tray 202; (4) depositing the photo-luminescent material layer 216 on the elastomer 214; and (5) potting the elastomer 218 over the photo-luminescent material layer 216; and (6) packaging the lighting system.

As discussed above, the lighting system may be configured to provide a line of light in some embodiments. In some examples, the linear lighting systems disclosed herein may provide a line of light along the linear lighting system having a substantially uniform intensity. Thereby, the location of the LEDs within the lighting system may be indistinguishable to a viewer. These lighting systems may be employed in any of a variety of direct view applications including architectural lighting, commercial lighting, hospitality lighting, residential lighting, office lighting, hallway lighting, bath lighting, and vanity lighting. For example, the lighting system may be employed in 1 inch slot to create a glare free, architectural lighting accent. These lighting systems may be constructed as connected strips, such as the linear lighting systems shown in FIGS. 1A and 1B, that may advantageously allow the lighting systems to achieve continuous runs in various installation situations such as: outside corners, inside corners, T-connections, and fully seamless corners.

The lighting system may employ any of a variety of systems to provide a line of light, such as lenses and diffusive elements. FIGS. 3 and 4 shows an example implementation of lighting system 102 that provides a line of light. In particular, FIG. 3 shows an example cross-section of the example lighting system and FIG. 4 shows a deconstructed version of the example lighting system. As shown, the lighting system includes a tray 302 into which a circuit board 304 with LEDs 306 mounted thereon may be disposed. The tray 302, circuit board 304, and LEDs 306 may be constructed similarly (or identically) to the tray 202, the circuit board 210, and the LED 212, respectively, described above. The circuit board 306 may include a connector 402 that may electrically couple the LEDs 306 mounted on the circuit board 306 to an external power source. A lens 308 may be disposed over the LEDs 306 (e.g., so as to provide an air gap between the LEDs 306 and an inner surface of the lens 308) and configured to increase a maximum emission angle of light from the LED 306. The lens 308 may, for example, be partially encapsulated in an elastomer 312 so as to expose a top portion of the lens 308 to air. A sleeve 310 may be slid over the tray 302 so as to provide an air gap 314 between the top of the lens 308 and the top side of the sleeve 310. A diffuser 316 may be disposed on the sleeve 310 that is configured to diffuse light from the LEDs 308.

The lenses 308 may be configured to increase a maximum emission angle of light from the LEDs 308. For example, the maximum emission angle of light from the LEDs 308 may be no more than ±60 degrees and the lens 308 may increase the maximum emission angle of the light from the LEDs to at least ±80 degrees. Additionally, the lens 308 may be configured to increase a light intensity at higher angles. For example, the light intensity from the LED 306 at ±60 degrees may be a first value and the lens 308 may increase the light intensity at ±60 degrees to a second value that is higher than the first value. An example construction of the lenses 308 is shown in FIG. 5 by lens 504 that is disposed over the LED 502. As shown, the lens 504 includes a cavity 503 into which the LED 502 may be disposed. The cavity 503 may form an air gap between the LED 502 and an inner surface of the lens 504. Additional materials may be disposed in the cavity 503 between the LED 502 and the inner surface of the lens 504 that are configured to change a characteristic of the light from the LED such as any of the scattering particles, photo-luminescence materials, and/or pigments described herein. These materials may be, for example, integrated into a polymer to form a monolithic element that may be disposed between the LED 502 and the inner surface of the lens 504.

The lens 504 is configured to increase the maximum angle of emission to ±80 degrees resulting in light being emitted over a span of 160 degrees in the light distribution pattern 500. It should be appreciated that the example construction of the lens 308 in FIG. 5 is only one possible implementation and that the lens 504 may be implemented in any of a variety of ways.

The elastomer 312 may encapsulate the top surface of the circuit board 304 and only a portion of the lenses 308. For example, the elastomer 312 may only be in contact with a bottom portion of the outer surface of the lens 308 while leaving an upper portion of the outer surface of the lens 308 exposed to air. Leaving a portion of the lens 308 may advantageously improve the performance the lens by, for example, maximizing a difference in refractive index of the lens 308 itself and the material into which the light from the lens propagates (e.g., air). The elastomer 312 may be constructed from any of a variety of materials, such as silicone. The elastomer 312 may have a lower refractive index such as a refractive index of approximately 1.4.

The sleeve 310 may be constructed as to be a hollow rectangle prism that surrounds the tray 302 and the components mounted therein. The sleeve 310 may be constructed from an elastomer, such as silicone. The sleeve 310 may be constructed from an extruding process (e.g., a silicone extruding process).

The diffuser 316 may be constructed to diffuse the light from the lenses 308 so as to provide a line of light. In some examples, the linear lighting systems disclosed herein may provide a line of light along the linear lighting system having a substantially uniform intensity. The diffuser 316 may be configured to diffuse light using any of a variety of techniques. In some embodiments, the diffuser 316 may include scattering particles that are configured to scatter light that are distributed throughout an elastomer (e.g., silicone) with a different (e.g., lower or higher) refractive index than the elastomer 312. For example, the refractive index of the elastomer 312 may have a refractive index of approximately 1.4 and the refractive index of the elastomer in the diffuser 316 may be approximately 1.5. The scattering particles may advantageously allow the diffuser 316 to be thin while still allowing the diffuser to effectively diffuse the light from the LEDs. Any of a variety of scattering particles may be employed such as Barium Sulfate (BaSO4) and/or Titanium Dioxide (TiO2). Additionally (or alternatively), the diffuser 316 may include one or more materials that are configured to change a characteristic of the light such as any of the photo-luminescence materials described herein and/or pigments.

The lighting system shown in FIGS. 3 and 4 may be manufactured in any of a variety of ways. The lighting system may be manufactured by, for example, performing the following steps: (1) mounting the electronic components (e.g., the LED 306 and/or the connector 402) to the circuit board 304; (2) inserting the circuit board into the tray 302; (3) placing the lenses 308 over the LEDs 306; (4) potting the elastomer 312 over the circuit board 304 in the tray 302; (5) inserting the tray 302 into the sleeve 310; (6) potting the material that includes the diffuser 316 (e.g., an elastomer with scattering particles, photo-luminescence materials, and/or pigments) over the sleeve 310; and (7) packaging the lighting system.

It should be appreciated that the lighting systems described herein may be designed to achieve any of a variety of desired light output characteristics. For example, a lighting systems described herein may be designed for a range of CCT values such as, 2,700 degrees K, 3,000 degrees K, 3,500 degrees K, 4,000 degrees K, and 5,000 degrees K; a range of CRI values such as any value between 90 and 100; a range of R9 color rendering values such as any value between 90 and 100; a range of light intensity values such as a range of 270-480 lumens per 12 inch section of lighting systems (e.g., per pair of two 6 inch lighting systems); a range of power consumption levels such as any wattage up to 9 Watts; and a range of voltage levels such as 24 Volts. Further, the lighting systems may be configured to be dimmable via any of a variety of external dimmable electronic drivers. Still yet further, the lighting system may configured to provide light within a 3-step Macadam ellipse and/or a 2-step Macadam ellipse of a predefined color coordinate. For example, the linear lighting system may be configured as a lighting strip configured to provide light within a 3-step Macadam ellipse and/or a 2-step Macadam ellipse of a predefined color coordinate along the length of the lighting strip.

Examples [100], [200], [300], [400] of lighting systems are discussed herein in connection with FIGS. 1-11. Examples [1200] and [1600] of lighting systems are discussed herein in connection with FIGS. 12-17. It is understood throughout this specification that a lighting system [100], [200], [300], [400] may include any of the features or combinations of features that are disclosed in connection with the examples [1200] or [1600] of lighting systems. It is further understood throughout this specification that a lighting system [1200] may include any of the features or combinations of features that are disclosed in connection with the Examples [100], [200], [300], [400] or [1600] of lighting systems. It is additionally understood throughout this specification that a lighting system [1600] may include any of the features or combinations of features that are disclosed in connection with the Examples [100], [200], [300], [400] or [1200] of lighting systems. Accordingly, FIGS. 1-11 and the entireties of the discussions of the examples [100], [200], [300], [400] of lighting systems are hereby incorporated into the following discussions of the examples [1200] and [1600] of implementations of the lighting system. In addition, the entirety of the discussion below of the examples [1600] of lighting systems is hereby incorporated into the following discussion of the examples [1200] of implementations of the lighting system; and the entirety of the discussion below of the examples [1200] of lighting systems is hereby incorporated into the following discussion of the examples [1600] of implementations of the lighting system.

Referring now to FIGS. 12-15, FIG. 12 presents a cross-sectional view of an example of a linear lighting system according to some embodiments of the technology described herein. FIG. 13 presents a top view, taken from the direction of the arrow 13, of the example of a linear lighting system shown in FIG. 12. FIG. 14 presents a cross-sectional view of another example of the linear lighting system [1200] according to some embodiments of the technology described herein. FIG. 15 presents a top view, taken from the direction of the arrow 15, of the another example of the linear lighting system [1200] shown in FIG. 14. Referring to FIGS. 12-15, a linear lighting system [1200] is provided, including a tray [1202] being extended along elongation directions [1204] and having a base forming a bottom interior surface [1207] of the tray [1202], a first sidewall [1208] extending upward from the base [1206] towards an emission aperture [1210] of the linear lighting system [1200], and a second sidewall [1212] being spaced apart across the base [1206] from the first sidewall [1208] and extending upward from the base [1206] towards the emission aperture [1210] of the linear lighting system [1200]. In these examples, the linear lighting system [1200] further includes: a circuit board [1214] being located on the first sidewall [1208] in the tray [1202]; a plurality of light emitting diodes (LEDs) [1216] being located on the circuit board [1214] and mutually spaced apart on the first sidewall [1208] along the elongation directions [1204] of the tray [1202] and being positioned for light emissions in directions [1215] facing toward the second sidewall [1212]; and a protuberance [1218] being located on the base [1206] and interposed between the LEDs [1216] and the second sidewall [1212], the protuberance [1218] being positioned for diverting light emissions from the plurality of the LEDs [1216] toward the emission aperture [1210].

In some examples [1200] of the lighting system, the tray [1202] may be triaxially or biaxially flexible. Referring to FIGS. 12-15, throughout this specification "triaxial" flexibility denotes flexibility in the directions of the arrows X, Y and Z; and "biaxial" flexibility denotes flexibility in two of the three directions of the arrows X, Y and Z. In further examples [1200] of the lighting system, the circuit board

[1214] may be triaxially or biaxially flexible in the directions of the arrows X, Y and Z.

In some examples [1200] of the lighting system, the protuberance [1218] shown in FIGS. 12-15 may have an angled or convex surface [1220] for diverting light emissions from the LEDs [1216] toward the emission aperture [1210]. In some examples [1200] of the lighting system, the convex surface [1220] of the protuberance [1218] shown in FIGS. 12-13 may be smoothly convex. In further examples [1200] of the lighting system, the angled surface of the protuberance [1218] may have a geometric prismatic shape as shown in FIGS. 14-15. In additional examples [1200] of the lighting system, the geometric prismatic shape of the protuberance [1218] may include a triangular prism as shown in FIGS. 14-15, or (not shown) may be likewise substituted by a rectangular prism, a pentagonal prism, or a hexagonal prism. In additional examples [1200] of the lighting system, the protuberance [1218] may include a raised mound [1218] as shown in FIGS. 12-13 and located on the base [1206] and extending along the elongation directions [1204] of the tray [1202], the raised mound [1218] being positioned to intersect pathways of some of the light emissions from the LEDs [1216]. In other examples [1200] of the lighting system, the protuberance [1218] may include a plurality of raised mounds [1218] as shown in FIGS. 14-15 being located on the base [1216] and being mutually spaced apart along the elongation directions [1204] of the tray [1202], each one of the plurality of the raised mounds [1218] being positioned to intersect pathways of some of the light emissions from the LEDs [1216]. In some examples [1200] of the lighting system, each one of the plurality of the raised mounds [1218] as shown in FIGS. 14-15 may have an angled or convex surface [1220] for diverting light emissions from the LEDs [1216] toward the emission aperture [1210]. In further examples [1200] of the lighting system, each one of the convex surfaces [1220] of the raised mounds [1218] as shown in FIGS. 14-15 may be smoothly convex. In additional examples [1200] of the lighting system, each one of the angled surfaces [1220] of the raised mounds [1218] may have a geometric prismatic shape as shown in FIGS. 14-15. In some examples [1218] of the lighting system, the geometric prismatic shape of each one of the protuberances [1218] may include a triangular prism as shown in FIGS. 14-15, or may likewise be substituted by a rectangular prism, a pentagonal prism, or a hexagonal prism. In some examples [1200] of the lighting system, the protuberance [1218] as shown in FIGS. 14-15 may have a highly light reflective surface [1220] for reflecting light emissions toward the emission aperture [1210]. In further examples [1200] of the lighting system, the protuberance [1218] as shown in FIGS. 14-15 may be a light-transmissive protuberance [1218] having a higher refractive index than air, for refracting light emissions toward the emission aperture [1210].

In additional examples [1200] of the lighting system as shown in FIGS. 12-15, the linear lighting system may include another circuit board [1222] being located on the second sidewall [1212] in the tray [1202], and may include a further plurality of light emitting diodes (LEDs) [1224] being located on the another circuit board [1222] and mutually spaced apart on the second sidewall [1212] along the elongation directions [1204] of the tray [1202] and being positioned for further light emissions in directions [1225] facing toward the first sidewall [1208]; and the protuberances [1218] may be positioned for diverting further light emissions from the further plurality of LEDs [1224] toward the emission aperture [1210]. In further examples [1200], the circuit board [1222] may be triaxially or biaxially flexible. In other examples [1200] of the lighting system, an interior [1207] of the tray [1202] may have a highly light reflective surface.

In some examples [1200], the linear lighting system may further include a plurality of lenses [1226] as shown in FIGS. 12-15, each one of the plurality of lenses [1226] being located over a respective one of the plurality of the LEDs [1216] for increasing a maximum light emission angle of the LED [1216] from a first value to a second value that is larger than the first value. As an example, each one of a plurality of lenses [1226] may be positioned on a one of the LEDs [1216]. In further examples, the linear lighting system [1200] may further include a diffuser located over the plurality of the lenses [1226]; and the plurality of the lenses [1226] and the diffuser may cause the linear lighting system [1200] to emit the light emissions as a line of light. In some examples, the linear lighting systems [1200] disclosed herein may provide a line of light extended in the directions [1204] along the linear lighting system [1200] having a substantially uniform intensity. It is understood throughout this specification that a diffuser may be formed as, for example, a sheet positioned in the tray [1202] facing and over the LEDs [1216], or a volumetric body that fills a portion or all of the tray [1202], or a sheet positioned inside the tray [1202] having one side facing the bottom [1207] and another opposite side facing the emission aperture [1210], or a sheet placed over the top of the tray [1202]. In additional examples [1200] of the lighting system, the first value of the maximum light emission angle may be no more than about sixty (60) degrees and the second value of the maximum emission angle may be at least about eighty (80) degrees. In other examples [1200], the linear lighting system may include a further plurality of lenses [1228] as shown in FIGS. 12-15, each one of the further plurality of lenses [1228] being located over a respective one of the another plurality of the LEDs [1224] for increasing a maximum light emission angle from a first value to a second value that may be larger than the first value. In some examples, the linear lighting system [1200] as shown in FIGS. 12-15 may further include another diffuser located over the further plurality of the lenses [1228], and the further plurality of the lenses [1228] and the another diffuser may cause the linear lighting system [1220] to emit the further light emissions as a line of light. In some examples, the linear lighting systems [1200] disclosed herein may provide a line of light extended in the directions [1204] along the linear lighting system having a substantially uniform intensity.

Referring now to FIGS. 16-17, FIG. 16 presents a cross-sectional view of an example of another linear lighting system [1600] according to some embodiments of the technology described herein. FIG. 17 presents a top view, taken from the direction of the arrow 17, of the example of a linear lighting system [1600] shown in FIG. 16. Referring to FIGS. 16-17, a linear lighting system [1600] is provided, having a tray [1602] being extended along elongation directions [1604] and having a base [1606] forming a bottom interior surface [1607] of the tray [1602], a first sidewall [1608] including an angled reflective face [1609] and extending upward from the base [1606] towards an emission aperture [1610] of the linear lighting system, and a second sidewall [1612] including a further angled reflective face [1611] and extending upward from the base [1606] towards the emission aperture [1610] of the linear lighting system, the second sidewall [1612] being spaced apart across the base [1606] from the first sidewall [1608].

In some examples [1600], the angled reflective face(s) [1609] may form a portion but not all of the first sidewall [1608], and the further angled reflective face(s) [1611] may form a portion but not all of the second sidewall [1612]. In further examples [1600], the second sidewall [1612] may, referring to FIG. 16, include an angled reflective face [1611] forming an obtuse angle relative to the direction of the arrow [1625], for reflecting light emissions in the direction of an arrow [1613] toward the emission aperture [1610]. In additional examples [1600], the second sidewall [1612] may, referring to FIG. 16, include another angled reflective face [1611] forming an acute angle relative to the direction of the arrow [1625], for likewise reflecting light emissions toward the emission aperture [1610]. In further examples [1600] (not all shown), the first or second sidewalls [1608], [1612] may each independently include one or more angled reflective faces [1609], [1611] each independently forming either an acute or obtuse angle relative to the direction of an arrow [1615] or [1625].

In the example [1600], the linear lighting system further includes: a circuit board [1614] being located on the first sidewall [1608] in the tray [1602], and another circuit board [1622] being located on the second sidewall [1612] in the tray [1602]; and a plurality of light emitting diodes (LEDs) [1616] being located on the circuit board [1614] and mutually spaced apart on the first sidewall [1608] along the elongation directions [1604] of the tray [1602] and being positioned for light emissions in directions [1615] facing toward the second sidewall [1612], and another plurality of light emitting diodes (LEDs) [1624] being located on the another circuit board [1622] and mutually spaced apart on the second sidewall [1612] along the elongation directions [1604] of the tray [1602] and being positioned for further light emissions in directions [1625] facing toward the first sidewall [1608]; wherein the further angled reflective face [1611] of the second sidewall [1612] is positioned for reflecting light emissions from the plurality of the LEDs [1616] toward the emission aperture [1610]; and wherein the angled reflective face [1608] of the first sidewall [1608] is positioned for reflecting further light emissions from the another plurality of the LEDs [1624] toward the emission aperture [1610].

In some examples of the another implementation [1600], the tray [1602] may be triaxially or biaxially flexible. In further examples of the another implementation [1600], the circuit board [1614] may be triaxially or biaxially flexible. In additional examples [1600] of the another implementation, the angled reflective face [1609] of the first sidewall [1608] may be oriented at an acute or obtuse angle relative to the directions [1625] of further light emissions toward the first sidewall [1608], and the further angled reflective face [1611] of the second sidewall [1612] may be oriented at another acute or obtuse angle relative to the directions [1615] of the light emissions toward the second sidewall [1612]. It is understood throughout this specification that an obtuse angle is an angle of greater than 90 degrees and of less than 180 degrees. In other examples [1600] of the another implementation, the angled reflective face [1609] of the first sidewall [1608] may be oriented at an acute angle of less than about 45 degrees relative to the directions [1625] of further light emissions toward the first sidewall [1608], and the further angled reflective face [1611] of the second sidewall [1612] may be oriented at another acute angle of less than 45 degrees relative to the directions [1615] of the light emissions toward the second sidewall [1612]. In further examples [1600] of the another implementation, the angled reflective face [1609] of the first sidewall [1608] may be oriented at an obtuse angle of between about 90 degrees and about 180 degrees relative to the directions [1625] of further light emissions toward the first sidewall [1608], and the further angled reflective face [1611] of the second sidewall [1612] may be oriented at another obtuse angle of between about 90 degrees and about 180 degrees relative to the directions [1615] of the light emissions toward the second sidewall [1612]. In some examples [1600] of the another implementation, the angled reflective face [1609] of the first sidewall may include a reflective bar [1609] extended along the elongation directions [1604] of the tray [1602] and located below the plurality of the LEDs [1616] in the tray [1602]. In further examples [1600] of the another implementation, the angled reflective face [1609] of the first sidewall [1608] may include a reflective bar [1609] extended along the elongation directions [1604] of the tray [1602] and located above the plurality of the LEDs[1616] in the tray. In additional examples [1600] of the another implementation, the angled reflective face [1609] of the first sidewall [1608] may be formed by a plurality of reflective rings [1909] each encircling a respective one of the plurality of LEDs[1616] in the tray [1602]. In other examples [1600] of the another implementation, the plurality of the reflective rings [1609] may have reflective surfaces being oriented at acute or obtuse angles relative to the directions [1625] of further light emissions toward the first sidewall [1608]. In some examples [1600] of the another implementation, the further angled reflective face [1611] of the second sidewall [1612] may be formed by a further plurality of reflective rings [1611] each encircling a respective one of the another plurality of LEDs [1624] in the tray. In further examples [1600] of the another implementation, the further plurality of reflective rings [1611] may have reflective surfaces being oriented at further acute or obtuse angles relative to the directions [1615] of light emissions toward the second sidewall [1612].

In further examples of the another implementation [1600], the circuit board [1622] may be triaxially or biaxially flexible. In additional examples [1600] of the another implementation, the further angled reflective face [1611] of the second sidewall [1612] may be oriented at an acute or obtuse angle relative to the directions [1615] of light emissions toward the second sidewall [1612], and the angled reflective face [1609] of the first sidewall [1608] may be oriented at another acute or obtuse angle relative to the directions [1625] of the further light emissions toward the first sidewall [1608].

In other examples [1600] of the another implementation, the further angled reflective face [1611] of the second sidewall [1612] may be oriented at an acute angle of less than about 45 degrees relative to the directions [1615] of light emissions toward the second sidewall [1612], and the angled reflective face [1609] of the first sidewall [1608] may be oriented at another acute angle of less than 45 degrees relative to the directions [1625] of the further light emissions toward the first sidewall [1608]. In further examples [1600] of the another implementation, the further angled reflective face [1611] of the second sidewall [1608] may be oriented at an obtuse angle of between about 90 degrees and about 180 degrees relative to the directions [1615] of light emissions toward the second sidewall [1612], and the angled reflective face [1609] of the first sidewall [1608] may be oriented at another obtuse angle of between about 90 degrees and about 180 degrees relative to the directions [1625] of the further light emissions toward the first sidewall [1608]. In some examples [1600] of the another implementation, the further angled reflective face [1611] of the second sidewall [1612] may include a reflective bar [1611] extended along the elongation directions [1604] of the tray [1602] and located below the plurality of the LEDs [1624] in the tray [1602]. In further examples [1600] of the another implementation, the further angled reflective face [1611] of the second sidewall [1612] may include a reflective bar [1611] extended along the elongation directions [1604] of the tray [1602] and located above the plurality of the LEDs [1624] in the tray [1602]. In additional examples [1600] of the another implementation, the further angled reflective face [1611] of the second sidewall [1612] may be formed by a plurality of reflective rings [1611] each encircling a respective one of the plurality of LEDs [1624] in the tray [1602]. In other examples [1600] of the another implementation, the plurality of the reflective rings [1611] may have reflective surfaces being oriented at acute or obtuse angles relative to the directions [1615] of light emissions toward the second sidewall [1612].

In some examples [1600], the linear lighting system may further include a plurality of lenses [1626] as shown in FIGS. 16-17, each one of the plurality of lenses [1626] being located over a respective one of the plurality of the LEDs [1616] for increasing a maximum light emission angle of the LED [1616] from a first value to a second value that is larger than the first value. As an example, each one of a plurality of lenses [1626] may be positioned on a one of the LEDs [1616]. In further examples, the linear lighting system [1600] may further include a diffuser located over the plurality of the lenses [1626]; and the plurality of the lenses [1626] and the diffuser may cause the linear lighting system [1600] to emit the light emissions as a line of light. In some examples, the linear lighting systems [1600] disclosed herein may provide a line of light extended in the directions [1604] along the linear lighting system [1600] having a substantially uniform intensity. The diffuser may be formed as, for example, a sheet positioned in the tray [1602] facing and over the LEDs [1616], or a volumetric body that fills a portion or all of the tray [1602], or a sheet positioned inside the tray [1602] having one side facing the bottom [1607] and another opposite side facing the emission aperture [1610], or a sheet placed over the top of the tray [1602]. In additional examples [1600] of the lighting system, the first value of the maximum light emission angle may be no more than about sixty (60) degrees and the second value of the maximum emission angle may be at least about eighty (80) degrees. In other examples [1600], the linear lighting system may include a further plurality of lenses [1628], each one of the further plurality of lenses [1628] being located over a respective one of the another plurality of the LEDs [1624] for increasing a maximum light emission angle from a first value to a second value that may be larger than the first value. In some examples, the linear lighting system [1600] may further include another diffuser located over the further plurality of the lenses [1628], and the further plurality of the lenses [1628] and the another diffuser may cause the linear lighting system [1600] to emit the further light emissions as a line of light. In some examples, the linear lighting systems [1600] disclosed herein may provide a line of light extended in the directions [1604] along the linear lighting system having a substantially uniform intensity.

The linear lighting systems disclosed herein may be installed indoors on walls, ceilings, or floors, and may also be installed on building exteriors, as examples. Further, the linear lighting systems may be utilized for achieving particular lighting needs, such as lighting for offices, industrial environments, kitchens, building exteriors, landscape lighting, and vehicle lighting. The protuberances and angled reflective faces of the linear lighting systems disclosed herein may redirect some of the light emissions of the LEDs, thereby reducing glare that may be caused by light being directly emitted from the linear lighting systems. Various aspects of the present disclosure may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately," "about," and "substantially" may be used to mean within ±20% of a target value in some embodiments, within ±10% of a target value in some embodiments, within ±5% of a target value in some embodiments, and yet within ±2% of a target value in some embodiments. The terms "approximately," "about," and "substantially" may include the target value.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

While the present invention has been disclosed in a presently defined context, it will be recognized that the present teachings may be adapted to a variety of contexts consistent with this disclosure and the claims that follow. For example, the lighting systems shown in the figures and discussed above can be adapted in the spirit of the many optional parameters described.

What is claimed is:

1. A linear lighting system, comprising:
   a tray being extended along elongation directions and having a base forming a bottom interior surface of the tray, a first sidewall connected to the base and extending upward from the base towards an emission aperture of the linear lighting system, and a second sidewall connected to the base and being spaced apart across the base from the first sidewall and extending upward from the base towards the emission aperture of the linear lighting system;
   a circuit board being located on the first sidewall in the tray;
   a plurality of light emitting diodes (LEDs) being located on the circuit board and mutually spaced apart on the first sidewall along the elongation directions of the tray and being positioned for light emissions in directions facing toward the second sidewall; and
   a protuberance being located on the base and interposed between the LEDs and the second sidewall, the protuberance being positioned for diverting light emissions from the plurality of the LEDs toward the emission aperture.

2. The linear lighting system of claim 1, wherein the tray is triaxially or biaxially flexible.

3. The linear lighting system of claim 1, wherein the circuit board is triaxially or biaxially flexible.

4. The linear lighting system of claim 1, wherein the protuberance includes a raised mound located on the base and extending along the elongation directions of the tray, the raised mound being positioned to intersect pathways of some of the light emissions.

5. The linear lighting system of claim 4, wherein the protuberance has an angled or convex surface for diverting light emissions toward the emission aperture.

6. The linear lighting system of claim 5, wherein the convex surface of the protuberance is smoothly convex.

7. The linear lighting system of claim 6, wherein the angled surface of the protuberance has a geometric prismatic shape.

8. The linear lighting system of claim 7, wherein the geometric prismatic shape of the protuberance includes a triangular prism, a rectangular prism, a pentagonal prism, or a hexagonal prism.

9. The linear lighting system of claim 1, wherein the protuberance includes a plurality of raised mounds located on the base and being mutually spaced apart along the elongation directions of the tray, each one of the plurality of the raised mounds being positioned to intersect pathways of some of the light emissions.

10. The linear lighting system of claim 9, wherein each one of the plurality of the raised mounds has an angled or convex surface for diverting light emissions toward the emission aperture.

11. The linear lighting system of claim 10, wherein each one of the convex surfaces of the raised mounds is smoothly convex.

12. The linear lighting system of claim 11, wherein each one of the angled surfaces of the raised mounds has a geometric prismatic shape.

13. The linear lighting system of claim 12, wherein the geometric prismatic shape of each one of the protuberances includes a triangular prism, a rectangular prism, a pentagonal prism, or a hexagonal prism.

14. The linear lighting system of claim 1, wherein the protuberance has a highly light reflective surface for reflecting light emissions toward the emission aperture.

15. The linear lighting system of claim 1, wherein the protuberance is a light-transmissive protuberance having a higher refractive index than air, for refracting light emissions toward the emission aperture.

16. The linear lighting system of claim 1, including another circuit board being located on the second sidewall in the tray, and including a further plurality of light emitting diodes (LEDs) being located on the another circuit board and mutually spaced apart on the second sidewall along the elongation directions of the tray and being positioned for further light emissions in directions facing toward the first sidewall; wherein the protuberance is positioned for diverting further light emissions from the further plurality of LEDs toward the emission aperture.

17. The linear lighting system of claim 1, wherein an interior of the tray has a highly light reflective surface.

18. The linear lighting system of claim 1, further including a plurality of lenses, each one of the plurality of lenses being located over a respective one of the plurality of the LEDs for increasing a maximum light emission angle of the LED from a first value to a second value that is larger than the first value.

19. The linear lighting system of claim 18, further including a diffuser located over the plurality of the lenses, wherein the plurality of the lenses and the diffuser cause the linear lighting system to emit the light emissions as a line of light.

20. The linear lighting system of claim 18, wherein the first value of the maximum light emission angle is no more than about sixty (60) degrees and the second value of the maximum emission angle is at least about eighty (80) degrees.

21. The linear lighting system of claim 18, including a further plurality of lenses, each one of the further plurality of lenses being located over a respective one of the another plurality of the LEDs for increasing a maximum light emission angle from a first value to a second value that is larger than the first value.

22. The linear lighting system of claim 19, further including another diffuser located over the further plurality of the lenses, wherein the further plurality of the lenses and the another diffuser cause the linear lighting system to emit the further light emissions as a line of light.

\* \* \* \* \*